United States Patent
Kobayashi et al.

(10) Patent No.: US 6,710,395 B2
(45) Date of Patent: Mar. 23, 2004

(54) NON-VOLATILE SEMICONDUCTOR MEMORY DEVICE WITH IMPROVED PERFORMANCE

(75) Inventors: Kiyoteru Kobayashi, Hyogo (JP); Osamu Sakamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/166,264

(22) Filed: Jun. 11, 2002

(65) Prior Publication Data

US 2003/0111685 A1 Jun. 19, 2003

(30) Foreign Application Priority Data

Dec. 19, 2001 (JP) .......................... 2001-386163

(51) Int. Cl.[7] .............................. H01L 29/788
(52) U.S. Cl. ................ 257/315; 257/315; 257/320
(58) Field of Search ................. 257/315, 314, 257/296; 438/264, 258; 357/235; 365/185

(56) References Cited

U.S. PATENT DOCUMENTS

| 5,021,848 A | * | 6/1991 | Chiu ............................ 257/317 |
| 5,830,794 A | * | 11/1998 | Kusunoki et al. ............ 438/266 |
| 5,856,223 A | * | 1/1999 | Wang ........................... 438/264 |
| 2002/0137290 A1 | * | 9/2002 | Wils et al. .................... 438/264 |

FOREIGN PATENT DOCUMENTS

| JP | 2001-28428 | 1/2001 |
| JP | 2001-85540 | 3/2001 |
| JP | 2001-85541 | 3/2001 |
| WO | WO 03/015172 A2 | * 6/2002 ......... H01L/27/115 |

* cited by examiner

Primary Examiner—David Nelms
Assistant Examiner—Thinh T Nguyen
(74) Attorney, Agent, or Firm—McDermott, Will & Emery

(57) ABSTRACT

The non-volatile semiconductor memory device includes: a semiconductor substrate having a main surface; $N^+$ diffusion layers formed spaced from each other at the main surface of the semiconductor substrate; a floating gate formed on a region between the $N^+$ diffusion layers with a silicon oxide film interposed; an access gate formed adjacent to the floating gate on the region between $N^+$ diffusion layers with a silicon oxide film interposed; and a control gate formed on the floating gate with an interlayer insulating film interposed. The $N^+$ diffusion layer is provided between the floating gates, and another $N^+$ diffusion layer is provided between the access gates. Thus performance of a memory transistor in a non-volatile semiconductor memory device is improved, reliability of the device is improved and miniaturization of the device is facilitated.

10 Claims, 23 Drawing Sheets

POSITION ON SUBSTRATE SURFACE

POSITION ON SUBSTRATE SURFACE

NON-VOLATILE SEMICONDUCTOR MEMORY DEVICE WITH IMPROVED PERFORMANCE

BACKGROUND OF THE INVENTION

1. Field of the Invention

The present invention relates to a non-volatile semiconductor memory device and manufacturing method thereof. More specifically, the present invention relates to a memory structure in a non-volatile semiconductor memory device and manufacturing method thereof.

2. Description of the Background Art

FIG. 14 shows an example of a memory cell structure of a conventional non-volatile semiconductor memory device. Referring to FIG. 14 $N^+$ diffusion layers 2 are formed spaced from each other at a main surface of a semiconductor substrate 1. An access gate and a floating gate are provided partially overlapping $N^+$ diffusion layers 2. The access gate is formed of a polycrystalline silicon film 18, and the floating gate is formed of a polycrystalline silicon film 6.

A silicon oxide film 19 is formed to cover polycrystalline silicon film 18, and a silicon oxide film 15 is formed to cover polycrystalline silicon film 6. On the access gate and the floating gate, a conductive film (control gate) 16 is formed, and on the conductive film 16, a silicon oxide film 17 is formed.

The method of manufacturing the non-volatile semiconductor memory device shown in FIG. 14 will be described with reference to FIGS. 15 to 21.

As shown in FIG. 15, on the main surface of semiconductor substrate 1, silicon oxide film 5 is grown by thermal oxidation. Thereafter, a phosphorus doped polycrystalline silicon film 6 is grown by CVD (Chemical Vapor Deposition) method, and a silicon nitride film 7 is deposited by the CVD method.

On silicon nitride film 7, a photoresist is applied, and the photoresist is formed to a desired pattern by photolithography. Using the resist pattern as a mask, silicon nitride film 7 is etched. Thereafter, the photoresist is removed, and as shown in FIG. 16, polycrystalline silicon film 6 is patterned using silicon nitride film 7 as a mask.

Thereafter, referring to FIG. 17, arsenic (As) is introduced obliquely to substrate 1, and thereafter annealing is performed in a nitrogen atmosphere. Thus, $N^+$ diffusion layer 2 of a memory transistor is formed.

Thereafter, silicon nitride film 7 is removed by hot phosphoric acid, and the exposed portion of silicon oxide film 5 is etched by using an HF solution. At this time, silicon oxide film 5 immediately below polycrystalline silicon film 6 is left. Thereafter, as shown in FIG. 18, an interlayer insulating film 15 is deposited by the CVD method.

Thereafter, referring to FIG. 19, a phosphorus doped polycrystalline silicon film 18 is deposited by the CVD method. By etching back the phosphorus doped polycrystalline silicon film 18, polycrystalline silicon film 18 is left between polycrystalline silicon films 6, as shown in FIG. 20. The polycrystalline silicon film 18 serves as an access gate.

Thereafter, as shown in FIG. 21, the surface of the access gate is thermally oxidized, to form a silicon oxide film 19. Thereafter, a phosphorus doped polycrystalline silicon film is deposited by the CVD method, and thereafter a WSi film is deposited by the CVD method, to form conductive film 16 shown in FIG. 14. On conductive film 16, a silicon oxide film 17 is deposited by the CVD method.

By photolithography and etching, conductive film 16 and silicon oxide film 17 are patterned to form stripes. Thus, control gates are formed. Thereafter, using the patterned conductive film 16 and silicon oxide film 17, interlayer insulating film 15 is etched. Thereafter, using the patterned interlayer insulating film 15 as a mask, polycrystalline silicon film 6 is etched to form a floating gate. Thus, a non-volatile semiconductor memory device shown in FIG. 14 is obtained.

In the non-volatile semiconductor memory device having the above described structure, information is stored in the memory cell in accordance with whether the threshold voltage of the memory transistor is high with electrons introduced to the floating gate, or the threshold voltage of the memory transistor is low with the electrons discharged from the floating gate.

In the state where electrons are introduced to the floating gate, the threshold voltage of the memory transistor has a high value Vthp, which state is also referred to as a written state. The stored charges are retained semi-permanently as they are, and therefore, the stored information is also maintained semi-permanently.

In the state where the electrons are discharged from the floating gate, the threshold voltage of the memory transistor has a low value Vthe, which state is referred to as an erased state. By detecting these two states, the data stored in the memory cell can be read.

Now, the operation of writing data to mth memory transistor in a memory area will be described with reference to FIG. 22.

The mth memory transistor includes a control gate, a mth floating gate, a mth access gate, a mth $N^+$ diffusion 2, a m+1th $N^+$ diffusion layer 2 and substrate 1.

At the time of writing, referring to FIG. 22, a high voltage Vp (about 12V) is applied to the control gate, and substrate 1 is grounded. A voltage of 2V is applied to the mth access gate, while 0V is applied to the m−1th and m+1th access gates. To mth $N^+$ diffusion layer 2, 5V is applied, while 0V is applied to m+1th $N^+$ diffusion layer 2.

Thus, hot electrons are generated in the channel of the mth memory transistor, and the electrons are introduced to the mth floating gate. As a result, the threshold voltage of the memory transistor increases.

At the time of erasure, a high voltage Ve (−20V) is applied to the control gate, and substrate 1, $N^+$ diffusion layer 2 and the access gate are grounded. Thus, electrons are discharged by the tunneling phenomenon, from the floating gate to substrate 1. As a result, the threshold voltage of the memory transistor lowers.

At the time of reading of a selected mth memory transistor, 3.3V, for example, is applied to the control gate, and 3.3V is applied to the m+1th $N^+$ diffusion layer 2, so that mth $N^+$ diffusion layer and the substrate 1 are grounded. Here, when the values are set such that Vthp>3.3V>Vthe, no current flows between the source and the drain of the memory transistor in the written state, while a current flows therebetween in the erased state.

The above described non-volatile semiconductor memory device, however, has the following problem. The problem will be described with reference to FIGS. 23A and 23B. In FIG. 23A, reference characters A, A', B and C represent paths of arsenic ions.

As already described, when $N^+$ diffusion layers 2 are formed, arsenic ions are introduced obliquely to substrate 1. Here, referring to FIG. 23A, in the paths A and A', arsenic ions directly reach substrate 1, so that the concentration of the introduced arsenic at the surface of substrate 1 can be defined as N' sin θ ((cm$^{-2}$).

When the introduction is along the path B, however, the arsenic ions are projected obliquely to polycrystalline silicon film 6. Here, arsenic ion must pass through the lower corner of polycrystalline silicon film 6 to reach substrate 1. Therefore, the amount of arsenic that reaches the substrate 1 is reduced as compared with the paths A and A'.

When the introduction is along the path C, arsenic ions introduced to substrate 1 are hindered by the silicon nitride film 7, and therefore the amount of arsenic reaching substrate 1 is reduced as compared with the paths A and A', as in the case of the path B.

Therefore, as represented by α in FIG. 23A, for example, N$^+$ diffusion layer 2 as the arsenic introduced region is formed with a concentration gradient. In FIG. 23B, the ordinate represents arsenic concentration at the surface of the substrate, while the abscissa represents position at the surface of the substrate.

When annealing is performed for 30 sec. in a nitrogen atmosphere at 850° C. after the introduction of arsenic, the arsenic diffuses, of which distribution is as represented by β in FIG. 23B. Here, when the region having the arsenic concentration of at least 1×10$^{19}$ cm$^{-2}$ is defined as the N$^+$ diffusion layer 2, then the width of the layer is X1.

As can be seen from FIG. 23B, the regions defined by α and β have almost trapezoidal shape, and the area of the regions become smaller than the area of a rectangular region. As the area of the regions represent the total amount of arsenic, that the area of the regions become smaller means that the total amount of arsenic introduced to N$^+$ diffusion layer 2 is small. Therefore, the resistance value of N$^+$ diffusion layer 2 becomes higher as compared with the size of N$^+$ diffusion layer 2.

In order to increase the total amount of arsenic introduced to N$^+$ diffusion layer 2 with the same amount of doping, it is necessary to attain such an arsenic distribution as represented by γ in FIG. 23B, in which the width of the region having the arsenic concentration of at least 1×10$^{19}$ cm$^{-2}$ in N$^+$ diffusion layer 2 must be increased to X2. Therefore, the size of N$^+$ diffusion layer 2 must be enlarged.

When arsenic ions reach substrate 1 after passing through silicon oxide film 5 which will be the tunnel insulating film, silicon oxide film 5 is damaged. This results in degradation of rewriting characteristic or data retention of the non-volatile semiconductor memory device, decreasing reliability of the non-volatile semiconductor memory device.

Further, N$^+$ diffusion layer 2 is formed below the access gate to a portion below the floating gate, as shown in FIG. 14. In order to form N$^+$ diffusion layer 2 to extend up to the portion below the floating gate, it is necessary to set the arsenic ion implantation energy so that the arsenic ions can reach substrate 1 after passing through the lower corner of polycrystalline silicon film 6, or it is necessary to diffuse arsenic to the portion below the floating gate by thermal processing.

When the arsenic ions are caused to pass through the lower corner of polycrystalline silicon film 6, the problem of lower reliability of the non-volatile semiconductor memory device mentioned above results. When the arsenic is diffused to the portion below the floating gate by thermal processing, N$^+$ diffusion layer 2 itself increases in size, making it difficult to miniaturize N$^+$ diffusion layer 2.

SUMMARY OF THE INVENTION

The present invention was made to solve the above described problems. An object of the present invention is to improve performance of a memory transistor in a non-volatile semiconductor memory device.

Another object of the present invention is to improve reliability of a memory transistor in a non-volatile semiconductor memory device.

A still further object of the present invention is to improve performance of a memory transistor in a non-volatile semiconductor memory device, to improve reliability and to facilitate miniaturization.

According to an aspect, the present invention provides a non-volatile semiconductor memory device including: a semiconductor substrate of a first conductivity type having a main surface; first and second impurity diffusion layers of a second conductivity type of a first memory cell formed spaced from each other at the main surface of the semiconductor substrate; a floating gate of the first memory cell formed on a region between the first and second impurity diffusion layers with a first insulating film interposed; an access gate of the first memory cell formed adjacent to the floating gate on a region between the first and second impurity diffusion layers with a second insulating film interposed; a control gate of the first memory cell formed on the floating gate with a third insulating film interposed; and another access gate of a second memory cell provided at a position adjacent to the access gate of the first memory cell, with the second impurity diffusion layer positioned therebetween.

As a set of access gates are positioned adjacent with each other with the second impurity diffusion layer positioned therebetween, it becomes unnecessary to form the second impurity diffusion layer from below the access gate to a portion below the floating gate. Therefore, unlike the prior art example, it becomes unnecessary to introduce the impurity of the second conductivity type obliquely to the substrate. Thus, concentration gradient as observed in the prior art example in the second impurity diffusion layer can be suppressed. Further, the damage to the first insulating film can also be avoided. Further, it becomes unnecessary to diffuse the impurity of the second conductivity type from below the access gate to a portion below the floating gate.

According to another aspect, the present invention provides a non-volatile semiconductor memory device including: a semiconductor substrate of a first conductivity type having a main surface; first and second impurity diffusion layers of a second conductivity type of a first memory cell formed spaced from each other at the main surface of the semiconductor substrate; a floating gate of the first memory cell formed on a region between the first and second impurity diffusion layers with a first insulating film interposed; an access gate of the first memory cell formed adjacent to the floating gate on a region between the first and second impurity diffusion layers with a second insulating film interposed; a control gate of the first memory cell formed on the floating gate with a third insulating film interposed; another floating gate of a second memory cell provided at a position adjacent to the floating gate of the first memory cell with the first impurity diffusion layer positioned therebetween; and another control gate of the second memory cell formed on the aforementioned another floating gate, with a fourth insulating film interposed.

In this aspect, again, it becomes unnecessary to form the first impurity diffusion layer from below the floating gate to the portion below the access gate. Therefore, generation of the concentration gradient as observed in the prior art in the first impurity diffusion layer can be suppressed, and the damage to the first insulating film can also be avoided.

Further, it becomes unnecessary to diffuse the impurity of the second conductivity type from below the floating gate to the portion below the access gate.

According to a still further aspect, the present invention provides a non-volatile semiconductor memory device including: a semiconductor substrate of a first conductivity type having a main surface; first and second impurity diffusion layers of a second conductivity type formed spaced from each other at the main surface of the semiconductor substrate; a floating gate formed on a region between the first and second impurity diffusion layers with a first insulating film interposed; an access gate having a sidewall shape formed adjacent to the floating gate on a region between the first and second impurity diffusion layers with a second insulating film interposed; and a control gate formed on the floating gate with a third insulating film interposed. Here, "sidewall shape" refers to such a film shape that has a curved upper surface, such as the shape of the polycrystalline silicon film 9 shown in FIG. 1.

As the access gate is formed to have a sidewall shape, it becomes possible to form the access gate in a self-aligned manner with the floating gate. Thus, the memory size can be reduced.

Preferably, the non-volatile semiconductor memory device includes another floating gate provided at a position adjacent to the floating gate with a first impurity diffusion layer positioned therebetween, and another access gate having a sidewall shape provided at a position adjacent to the access gate with the second impurity diffusion layer positioned therebetween. Here, the first impurity diffusion layer is partially overlapped with the floating gate and the aforementioned another floating gate, while the second impurity diffusion layer is partially overlapped with the access gate and the aforementioned another access gate.

The method of manufacturing a non-volatile semiconductor memory device in accordance with the present invention includes the following steps. A non-volatile semiconductor memory device including a semiconductor substrate of a first conductivity type having a main surface, first and second impurity diffusion layers of a second conductivity type formed spaced from each other at the main surface of the semiconductor substrate, a floating gate formed adjacent to the first impurity diffusion layer with a first insulating film on said main surface of said semiconductor substrate interposed, an access gate formed adjacent to the floating gate and the second impurity diffusion layer with a second insulating film on the main surface of said semiconductor substrate interposed, a control gate formed on the floating gate with a third insulating film interposed. The method includes the steps of forming a pattern of the floating gate including first conductive film on said main surface of a semiconductor substrate with the first insulating film interposed; forming a first impurity diffusion layer of a second conductivity type, using the pattern of the floating gate as a mask; forming the second insulating film and a pattern of the access gate including second conductive film; and forming a second impurity diffusion layer of a second conductivity type, using the pattern of the access gate as a mask.

As the first impurity diffusion layer of the second conductivity type is formed between the patterns of the floating gates using the patterns of the floating gates as a mask as described above, it becomes possible to form the first impurity diffusion layer in a self-aligned manner with the adjacent pattern of the floating gate, without the necessity of introducing the impurity obliquely as in the prior art example. Similarly, the second impurity diffusion layer can also be formed in a self-aligned manner with respect to the adjacent pattern of the access gate. Thus, the area occupied by the first and second impurity diffusion layers serving as the source or drain of the memory transistor can be reduced and the resistance can be reduced.

Preferably, the step of forming the first and second impurity diffusion layers includes the step of introducing the impurity of the second conductivity type to the main surface from a direction vertical to the main surface. Here, "vertical direction" includes a direction substantially vertical to the main surface. For example, an implantation angle inclined by 7° from the vertical direction is considered substantially vertical.

As the impurity of the second conductivity type is introduced to the main surface from the direction vertical to the main surface, the concentration gradient of the first and second impurity diffusion layers can significantly be reduced as compared with the prior art. Further, the damage to the tunnel insulating film of the memory transistor caused by the impurity of the second conductivity type can be prevented.

Preferably, the step of forming the pattern of the access gate includes the step of forming a second insulating film to cover the pattern of the floating gate, forming a conductive film on the second insulating film, etching back the conductive film to leave the conductive film on sidewalls of the pattern of the floating gate, and removing the conductive film formed on one sidewall of the pattern of the floating gate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
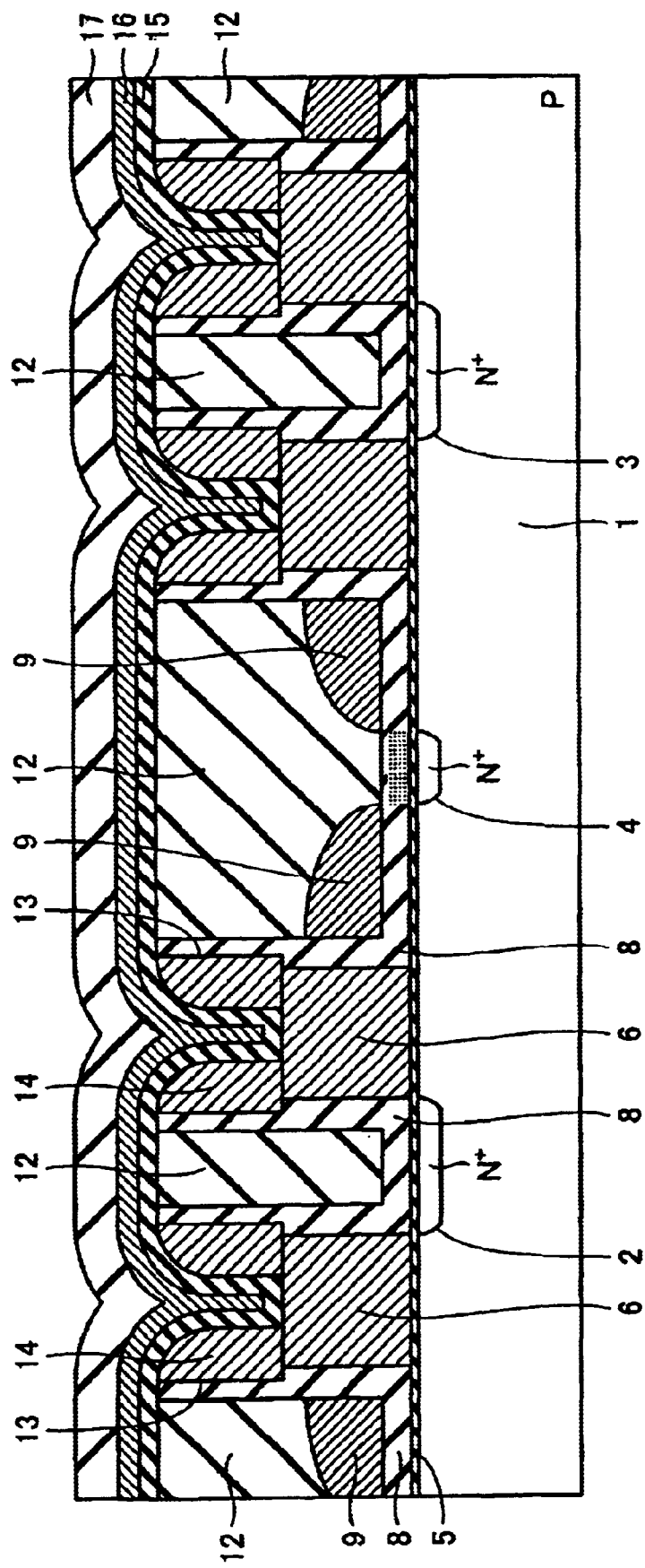
FIG. 1 is a cross sectional view of a non-volatile semiconductor memory device in accordance with one embodiment of the present invention.

An embodiment of the present invention will be described in the following with reference to FIGS. 1 to 13. FIG. 1 is a cross sectional view of a memory cell portion of the non-volatile semiconductor memory device in accordance with one embodiment of the present invention.

Referring to FIG. 1, at a main surface of a semiconductor substrate 1 such as a P type (001) silicon substrate, $N^+$ diffusion layers 2, 3 and 4 are formed spaced from each other. In the example shown in FIG. 1, the width of $N^+$ diffusion layers (first impurity diffusion layers) 2 and 3 is wider than the width of the $N^+$ diffusion layer (second impurity diffusion layer) 4.

A silicon oxide film (first insulating film) 5 of 10 nm is formed on the main surface. On the silicon oxide film 5, a phosphorus doped polycrystalline silicon film (first conductive film pattern) 6 of 130 nm is formed. Polycrystalline silicon film 6 will be the floating gate, and silicon oxide film 5 below polycrystalline silicon film 6 will be the tunnel insulating film.

On polycrystalline silicon film 6, a sidewall conductive film (projecting portion) 14 is formed. Sidewall conductive film 14 is formed on sidewalls of a recessed portion 13. By the provision of sidewall conductive film 14, capacitance between the floating gate and the control gate can be ensured.

A silicon oxide film (second insulating film) 8 of 30 nm is formed from the sidewall of polycrystalline silicon film 6 over silicon oxide film 5. A polycrystalline silicon film (second conductive film pattern) 9 is formed on silicon oxide film 8. Polycrystalline silicon film 9 will be the access gate.

Polycrystalline silicon film 9 is formed on the sidewall of polycrystalline silicon film 6 with silicon oxide film 8 interposed, and has a so-called sidewall shape. Polycrystalline silicon film 9 is formed in a self-aligned manner with respect to the polycrystalline silicon film 6, and has a moderately inclining upper surface. As the polycrystalline silicon film 9 is adapted to have the sidewall shape, the memory size can be reduced. The height of the polycrystalline silicon film (sidewall film) 9 is lower than polycrystalline silicon film 6. As can be seen from FIG. 1, the thickness of silicon oxide film 8 along the sidewall of recessed portion 13 is thinner than the thickness of silicon oxide film 8 between polycrystalline silicon film 9 and polycrystalline silicon film 6. Therefore, when the height of polycrystalline silicon film 9 is made lower than polycrystalline silicon film 6, decrease in breakdown voltage between polycrystalline silicon films 9 and 6 can be prevented.

As shown in FIG. 1, spaces between adjacent polycrystalline silicon films 6 are made different. In the example shown in FIG. 1, the space L2 (see FIG. 2) between polycrystalline silicon films 6 on both sides of $N^+$ diffusion layer 2 is smaller than the space L3 (see FIG. 2) between polycrystalline silicon films 6 on both sides of polycrystalline silicon films 9 which will be the access gate. More specifically, the space L2 is about ⅓ the space L3.

In the region where the space between polycrystalline silicon films 6 is relatively wide, a set of access gates are provided at adjacent positions, with $N^+$ diffusion layer 4 positioned therebetween. Here, what is necessary is that $N^+$ diffusion layer 4 is formed between the set of access gates. Therefore, it becomes unnecessary to form $N^+$ diffusion layer 4 extending from below the access gate to the portion below the floating gate. Therefore, different from the prior art, it is unnecessary to introduce N type impurity obliquely to substrate 1.

As a result, generation of such a concentration gradient as observed in the prior art in $N^+$ diffusion layer 4 can be prevented, and the resistance of $N^+$ diffusion layer 4 can be decreased. Further, the damage to the insulating film below the access gate can be avoided, and reliability of the memory transistor can be improved. Further, as it becomes unnecessary to diffuse the N type impurity from below the access gate to the portion below the floating gate by thermal processing or the like, miniaturization of the memory transistor is facilitated.

An end portion of $N^+$ diffusion layer 4 may be positioned immediately below an end portion of the access gate as shown in FIG. 1. Alternatively, $N^+$ diffusion layer 4 may be extended below the access gate such that the end portion of the access gate overlaps the end portion of $N^+$ diffusion layer 4. Alternatively, the end portion of $N^+$ diffusion layer 4 may be offset from the access gate, not overlapping the end portion of the access gate.

In the region where the space between polycrystalline silicon films (floating gates) 6 is relatively small, $N^+$ diffusion layers 2 and 3 are formed. Here, what is necessary is that $N^+$ diffusion layers 2 and 3 are formed between the set of floating gates, and therefore it becomes unnecessary to form $N^+$ diffusion layers 2 and 3 from below the access gate to the portion below the floating gate.

Therefore, similar to $N^+$ diffusion layer 4, the resistance of $N^+$ diffusion layers 2 and 3 can be reduced. Further, the damage to the tunnel insulating film can be suppressed. Therefore, reliability of the memory transistor is improved and miniaturization of the memory transistor is facilitated.

End portions of $N^+$ diffusion layers 2 and 3 may be positioned immediately below end portions of the floating gate as shown in FIG. 1. Alternatively, $N^+$ diffusion layers 2 and 3 may extend below the floating gate such that end portions of the floating gate overlap the end portions of $N^+$ diffusion layers 2 and 3. Alternatively, end portions of $N^+$ diffusion layers 2 and 3 may be offset from the floating gate and not overlap with the end portions of the floating gate.

$N^+$ diffusion layers 2 and 3 are formed self-aligned with polycrystalline silicon films (floating gates) 6 on both sides thereof, and $N^+$ diffusion layer 4 is formed self-aligned with polycrystalline silicon films (access gates) 9 on both sides thereof. Thus, areas occupied by $N^+$ diffusion layers 2 to 4 can be reduced and resistances thereof can also be reduced.

A silicon oxide film (insulating film) 12 is formed to fill the region between polycrystalline silicon films 6. An interlayer insulating film (third insulating film) 15 is formed from above silicon oxide film 12 over sidewall conductive film 14. Interlayer insulating film 15 has a stacked structure of a silicon oxide film of 5 nm, a silicon nitride film of 10 nm and a silicon oxide film of 5 nm, for example.

On interlayer insulating film 15, a conductive film 16 is formed. Conductive film 16 has a stacked structure of a phosphorus doped polycrystalline silicon film of 100 nm and an WSi film of 100 nm, for example, and it will be a control gate. On conductive film 16, a silicon oxide film (insulating film) 17 of 200 nm is formed.

The operation of the non-volatile semiconductor memory device having such a memory cell structure as shown in FIG. 1 will be described with reference to FIGS. 11 and 12. Here, the mth memory transistor includes a control gate, an mth floating gate, an mth access gate, an mth $N^+$ diffusion layer, an m+1th $N^+$ diffusion layer 4 and a semiconductor substrate 1.

Figure 11:
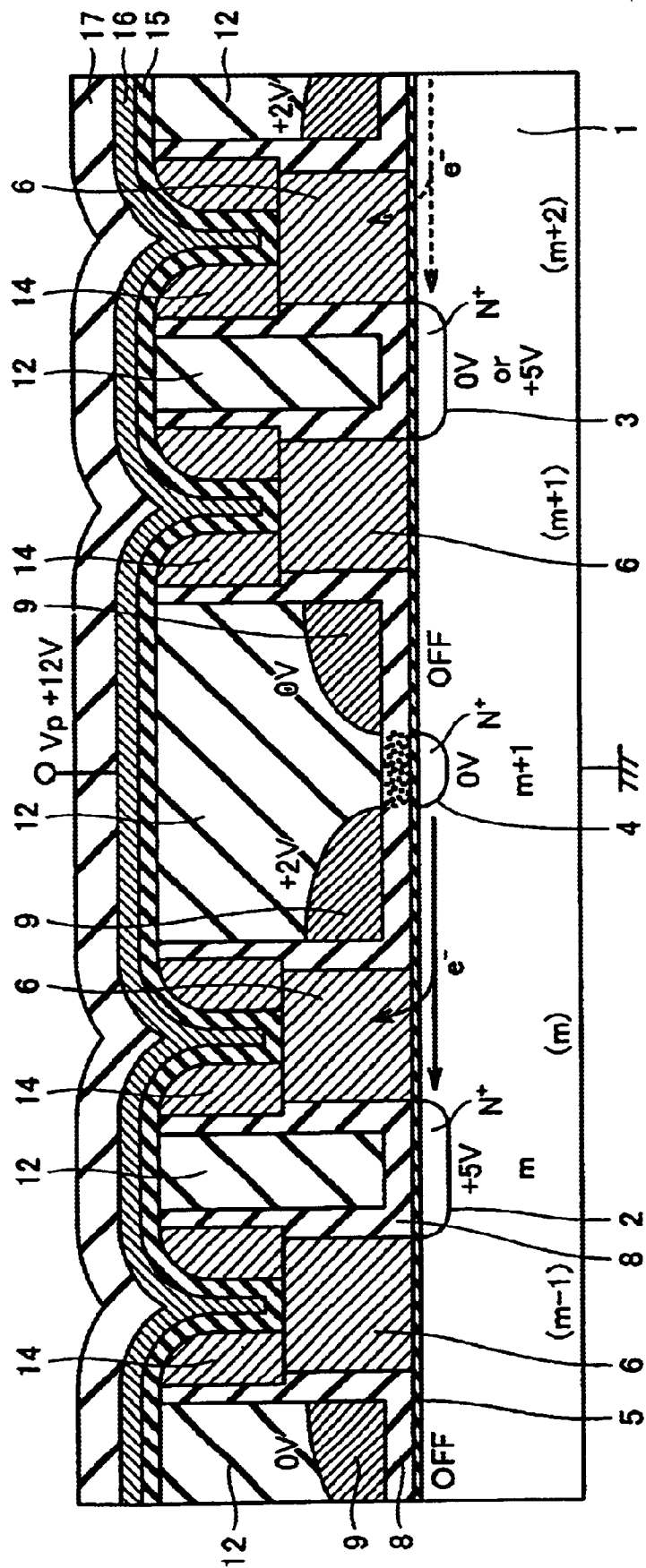
FIG. 11 illustrates a writing operation of the non-volatile semiconductor memory device shown in FIG. 1.

At the time of writing, as shown in FIG. 11, a high voltage Vp (about 12V) is applied to the control gate, and semiconductor substrate 1 is grounded. To the mth excess gate, 2V is applied and to the m−1th and m+1th access gates, 0V is applied. When the threshold voltage of the memory transistor is to be set to the high voltage Vthp, 5V is applied to mth N$^+$ diffusion layer 2 so that it will serve as a drain, and 0V is applied to m+1th N$^+$ diffusion layer 4 so that it will serve as a source.

Thus, hot electrons are generated in the channel of the memory transistor, and the electrons are introduced to the floating gate. As a result, the threshold voltage of the memory transistor increases.

Figure 12:
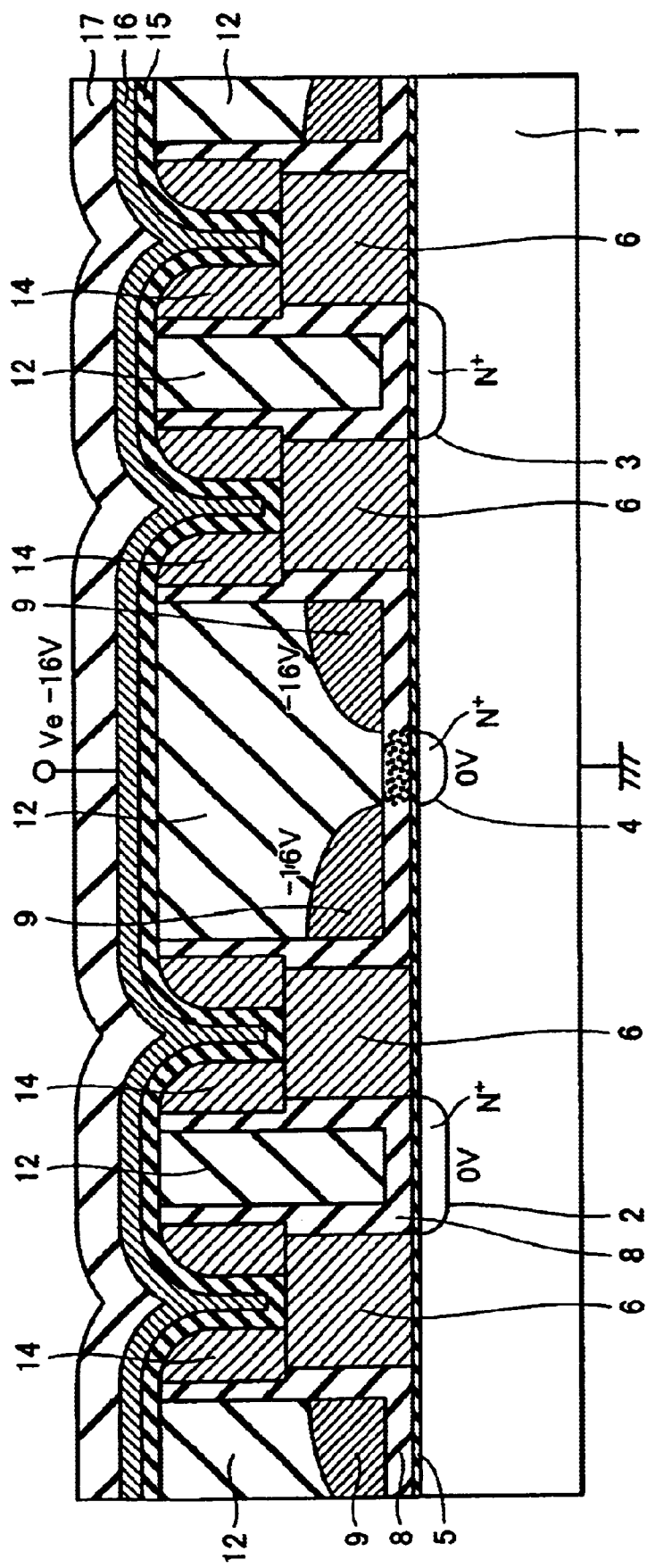
FIG. 12 illustrates an erasing operation of the non-volatile semiconductor memory device shown in FIG. 1.

At the time of erasure, as shown in FIG. 12, a negative high voltage Ve (about −16V) is applied to the control gate and the access gate, and semiconductor substrate 1 and N$^+$ diffusion layers 2 and 4 are grounded. More specifically, the potential of the control gate is made lower than the potentials of N$^+$ diffusion layers 2, 4 and of the semiconductor substrate 1. Further, the potential of the access gate is made lower than the potentials of N$^+$ diffusion layers 2, 4 and of the semiconductor substrate 1.

As a result, electrons are discharged by the tunneling phenomenon, from the floating gate to semiconductor substrate 1. As a result, the threshold voltage of the memory transistor lowers to the low value of Vthe.

In a read operation of a selected mth memory transistor, 3.3V, for example, is applied to the control gate, and 3.3V is applied to m+1th N$^+$ diffusion layer 4, and mth N$^+$ diffusion layer 2 and semiconductor substrate 1 are grounded. Further, 3.3V is applied to the access gate. Here, assuming that Vthp>3.3 (V)>Vthe, no current flows between the source (mth N$^+$ diffusion layer 2) and the drain (m+1th N$^+$ diffusion layer 4) of the memory transistor in the written state, while a current flows in the erased state.

The method of manufacturing a non-volatile semiconductor memory device having the structure above will be described in the following with reference to FIGS. 2 to 9.

Figure 2:
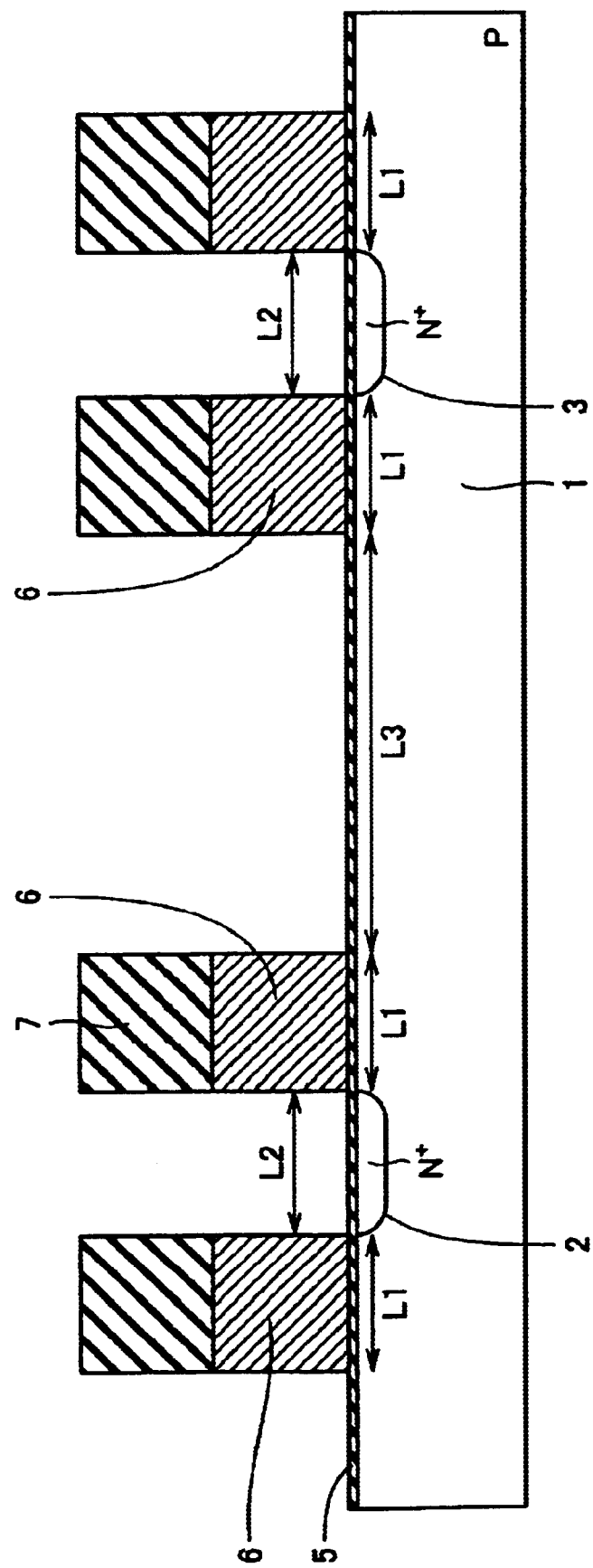
FIGS. 2 to 9 are cross sectional views showing the first to eighth steps of manufacturing the non-volatile semiconductor memory device shown in FIG. 1.

Referring to FIG. 2, a silicon oxide film (first insulating film) 5 of 10 nm is grown using thermal oxidation on the main surface of semiconductor substrate 1. Thereafter, a phosphorus doped polycrystalline silicon film 6 of 130 nm is grown by the reduced pressure CVD method, and thereafter a silicon nitride film 7 of 150 nm is deposited by the reduced pressure CVD method.

By photolithography and etching, silicon nitride film 7 is processed to stripes extending in a direction vertical to the surface of the sheet, using a photoresist as a mask. After the photoresist is removed, etching is performed using the silicon nitride film 7 as a mask, so that polycrystalline silicon film 6 is processed to a pattern. Thus, a plurality of conductive film patterns (first conductive film patterns) are formed.

Here, the spaces L2 and L6 between adjacent polycrystalline silicon films 6 are made different from each other as described above. In this example, the space L3 is made larger than L2. More specifically, the space L2 is made approximately the same as the width L1 of polycrystalline silicon film 6 in the channel length direction of the memory transistor, that is, ⅓ of the space L3, for example.

Figure 4:
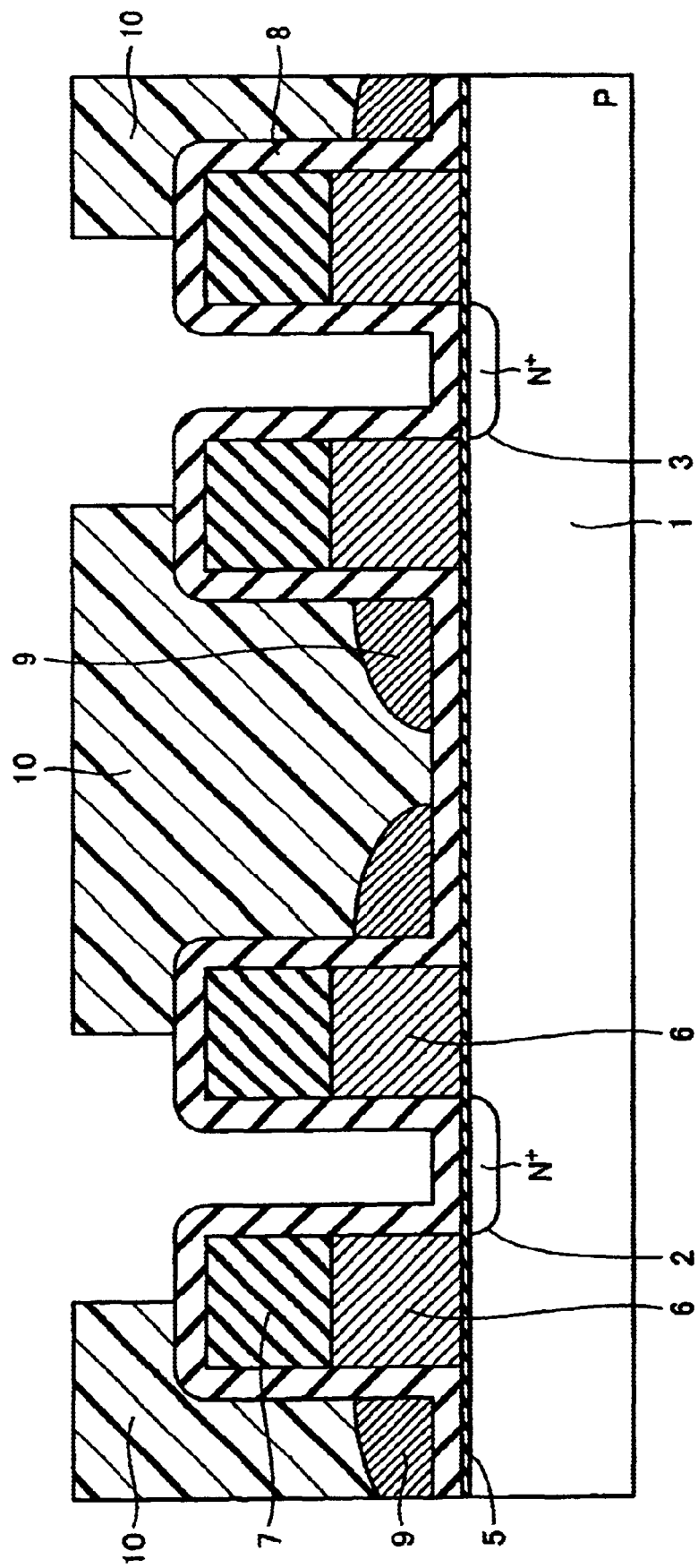

By photolithography, the photoresist is formed to have a desired pattern. For example, a photoresist pattern having the same shape as the photoresist pattern of FIG. 4 is formed. Using the photoresist pattern, silicon nitride film 7 and polycrystalline silicon film 6 as a mask, N type impurity ions such as arsenic ions are introduced to semiconductor substrate 1 under the condition of 40 keV and 4×10$^{15}$ cm$^{-2}$. More specifically, N type impurity ions are introduced to that region at which the space between the polycrystalline silicon films 6 is relatively narrow.

Figure 13A:
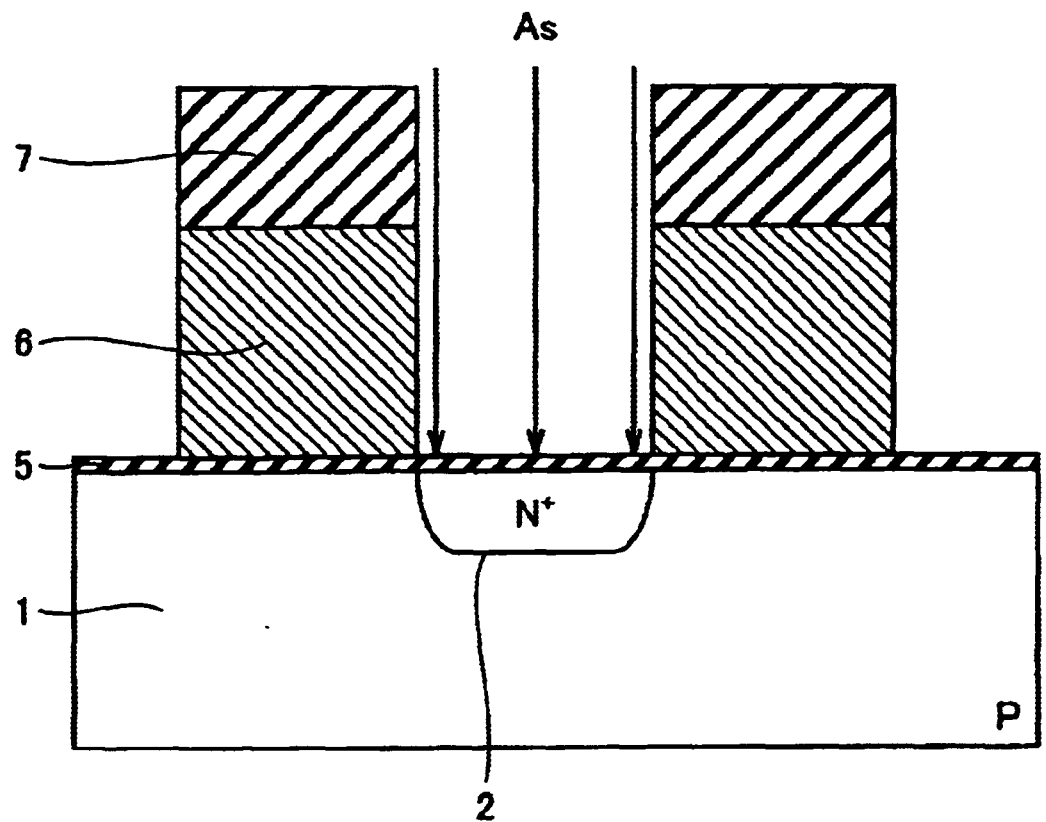
FIG. 13A is a cross section representing an example of the method of introducing arsenic in accordance with the present invention.

At this time, arsenic ions are introduced to semiconductor substrate 1 in a direction vertical to the main surface of semiconductor substrate 1 as shown in FIG. 13A. Here, the arsenic ions may be introduced from a direction that can be considered substantially vertical to the main surface.

Figure 13B:
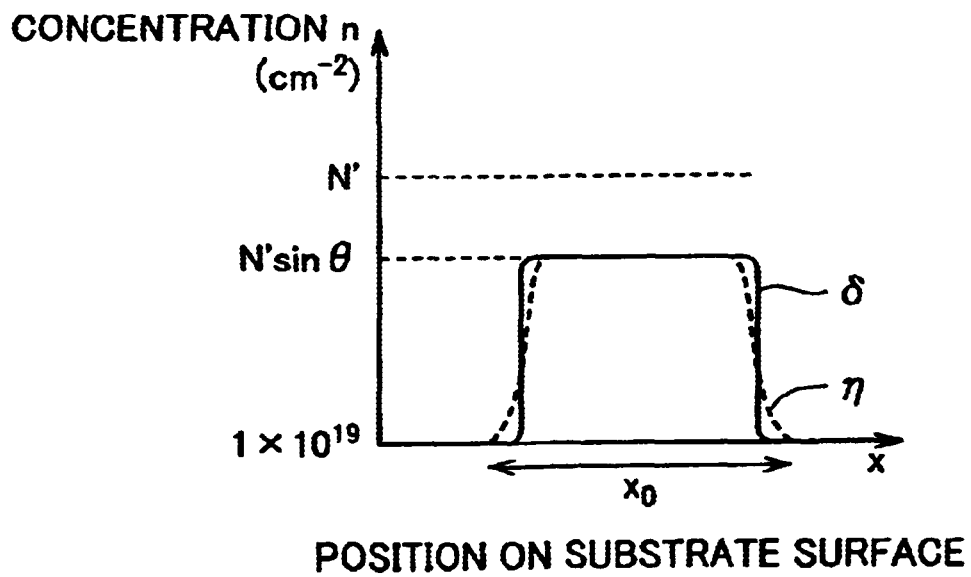
FIG. 13B shows an exemplary concentration distribution of arsenic in accordance with the present invention.
Figure 14:
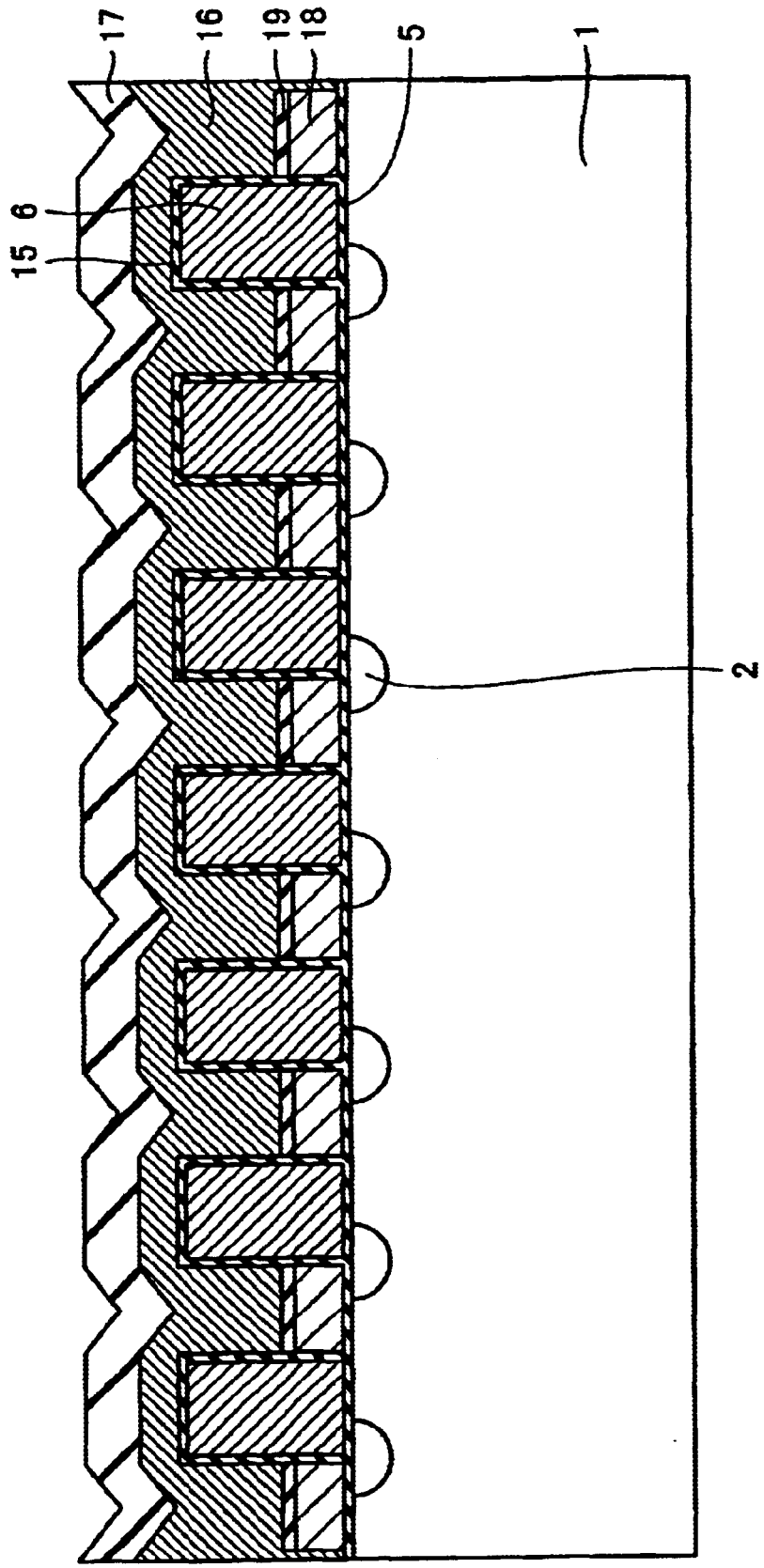
FIG. 14 is a cross sectional view of a conventional non-volatile semiconductor memory device.
Figure 15:
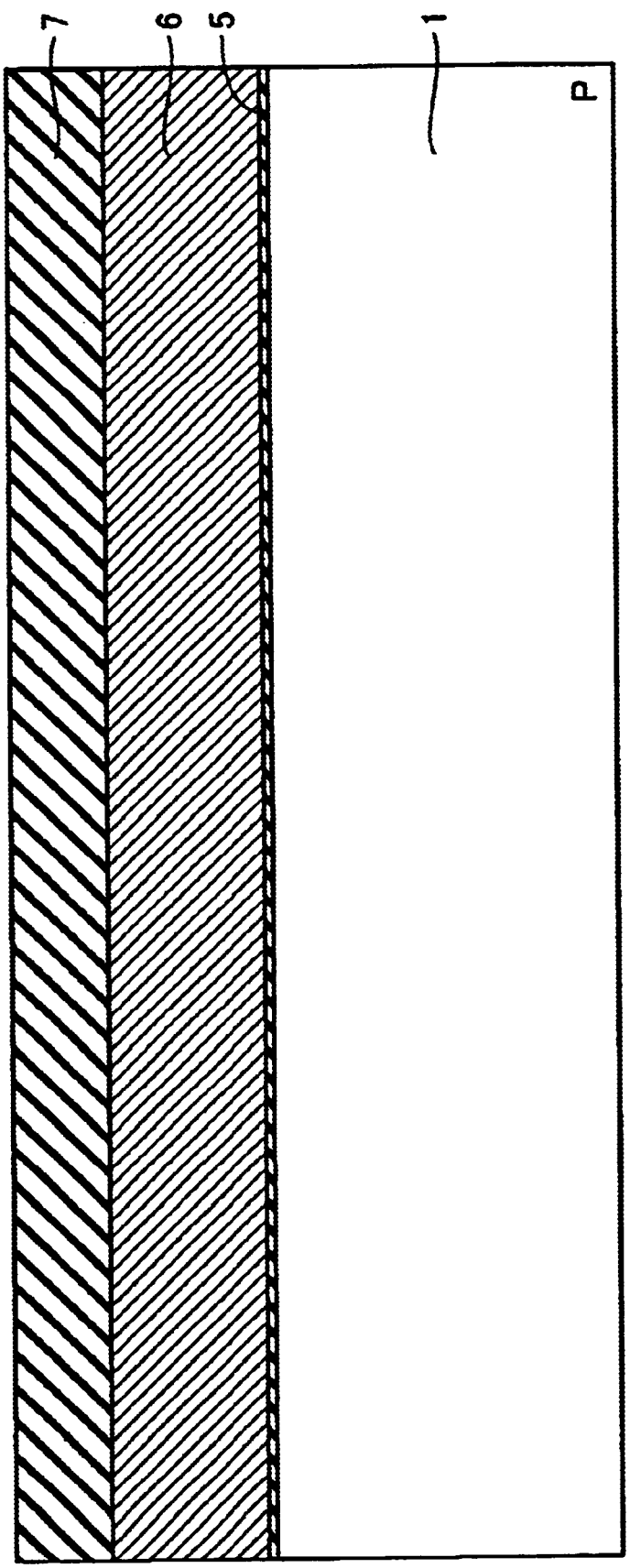
FIGS. 15 to 21 are cross sections representing the first to seventh steps of manufacturing the conventional non-volatile semiconductor memory device.
Figure 16:
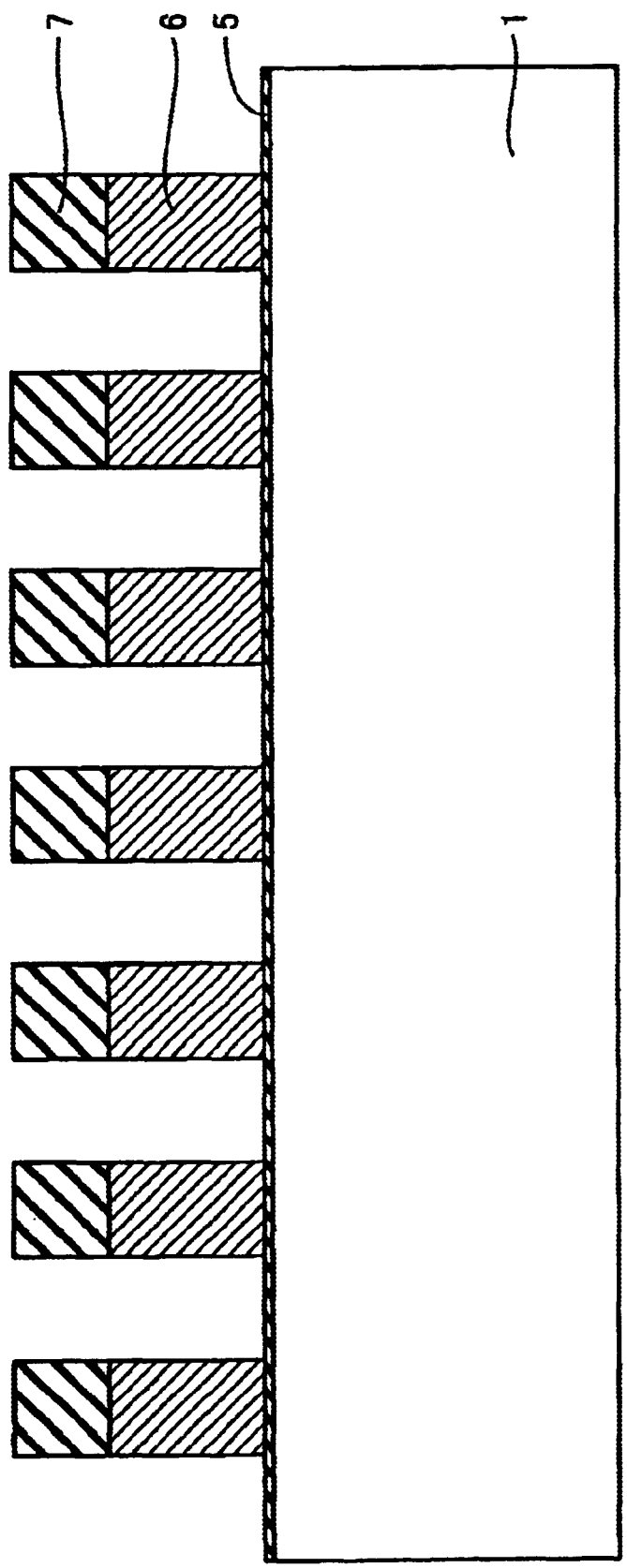
Figure 17:
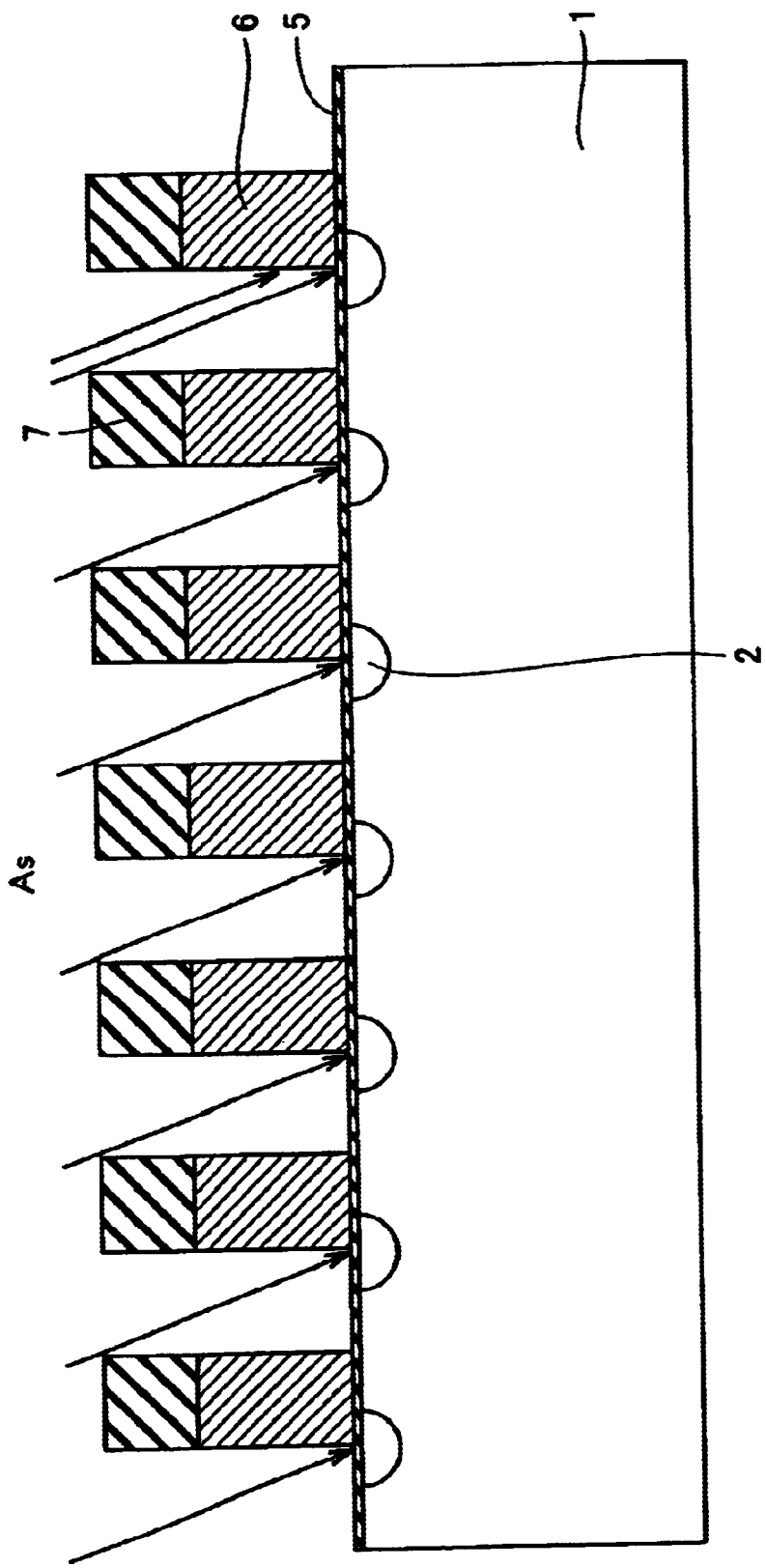
Figure 18:
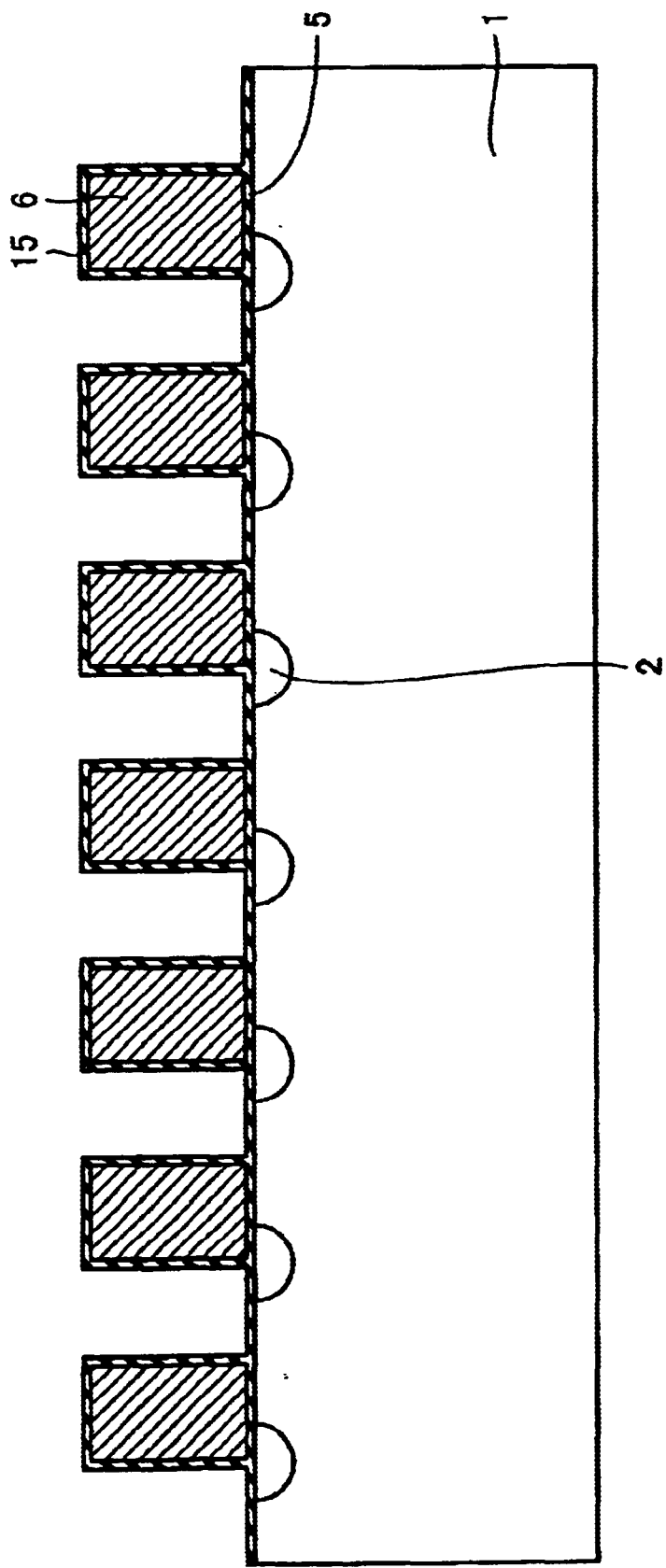
Figure 19:
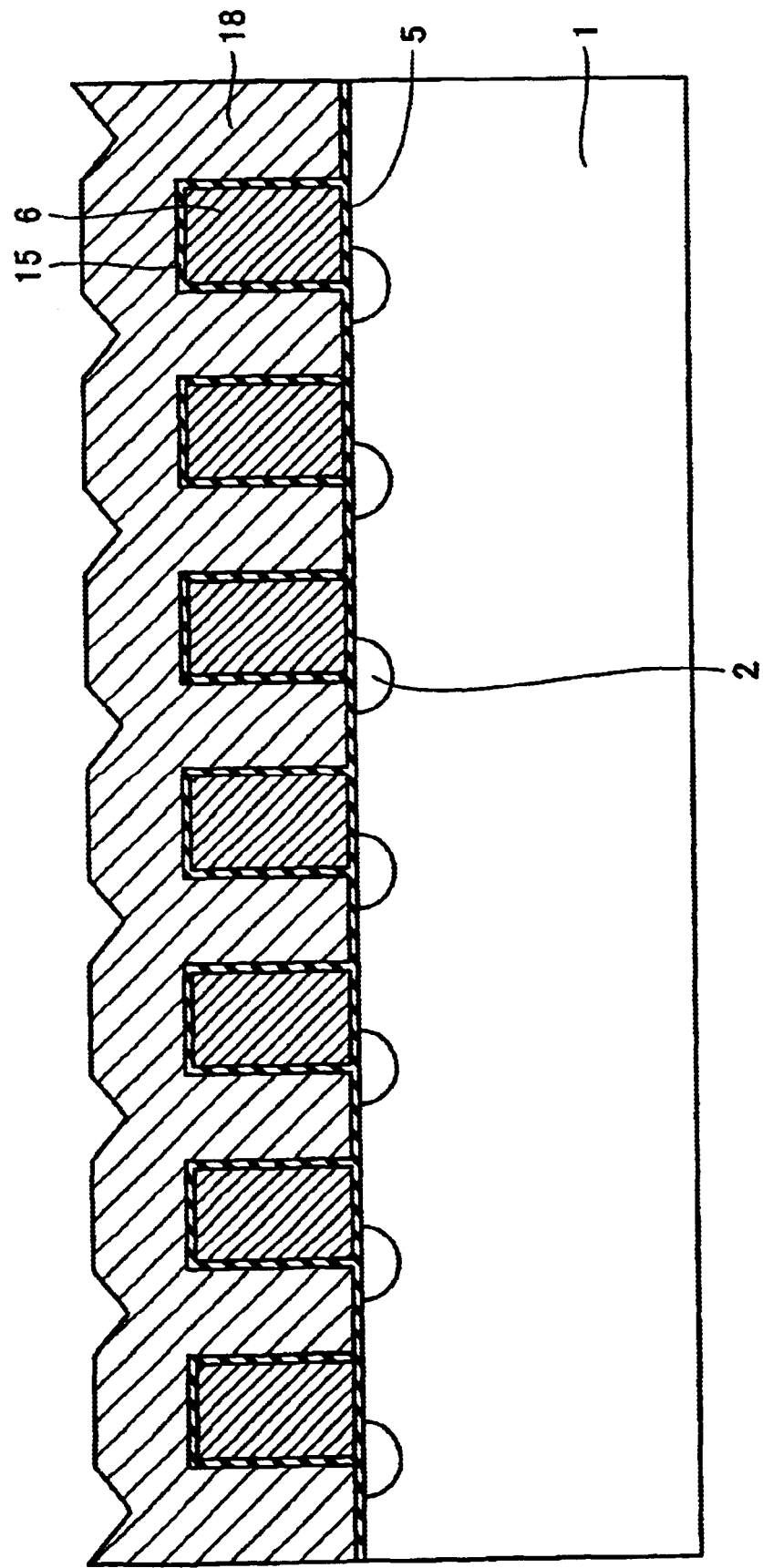
Figure 20:
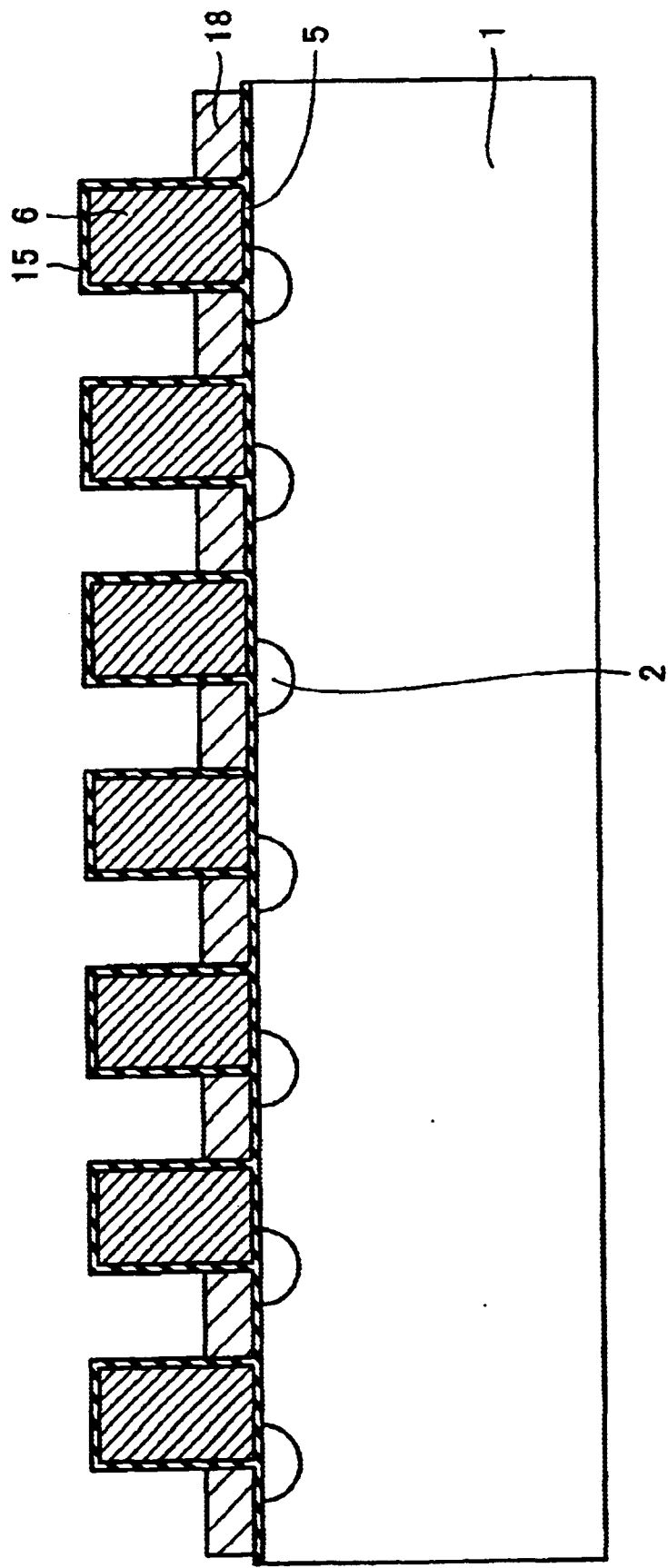
Figure 21:
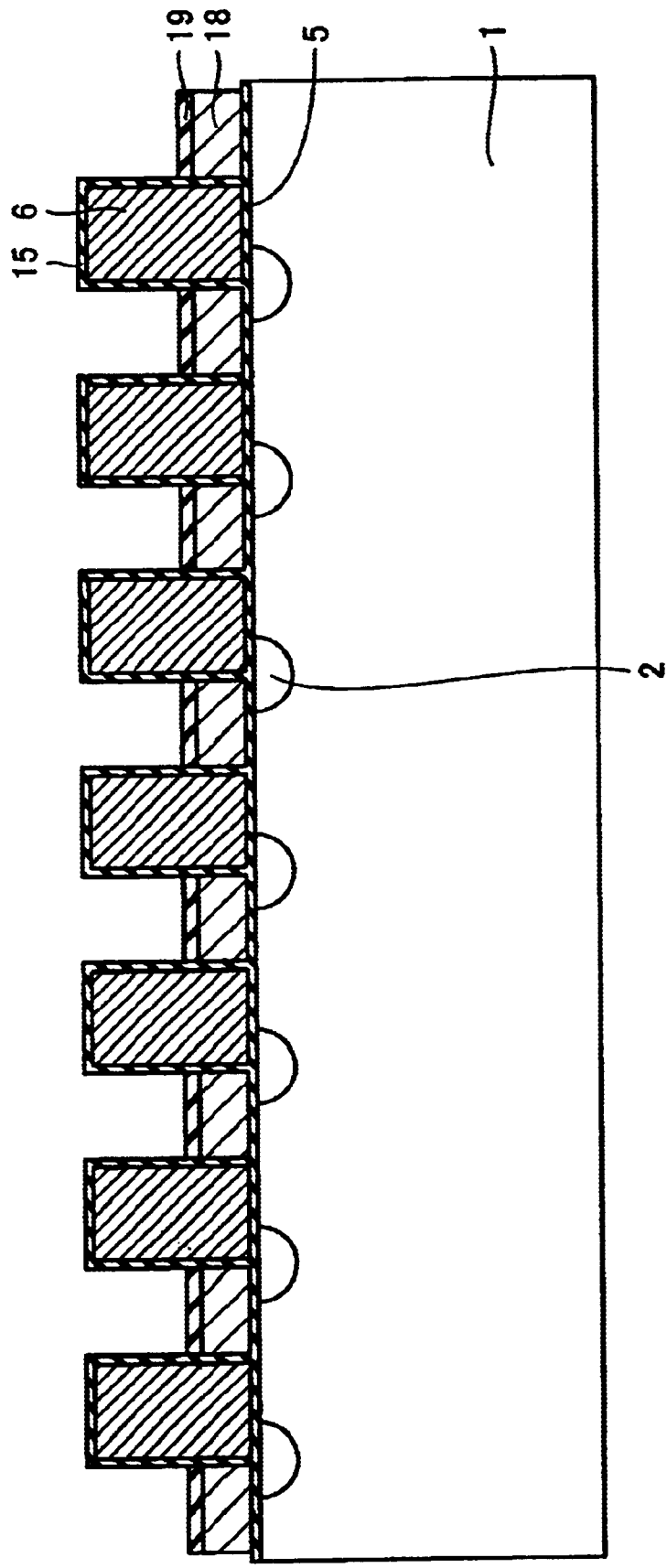
Figure 22:
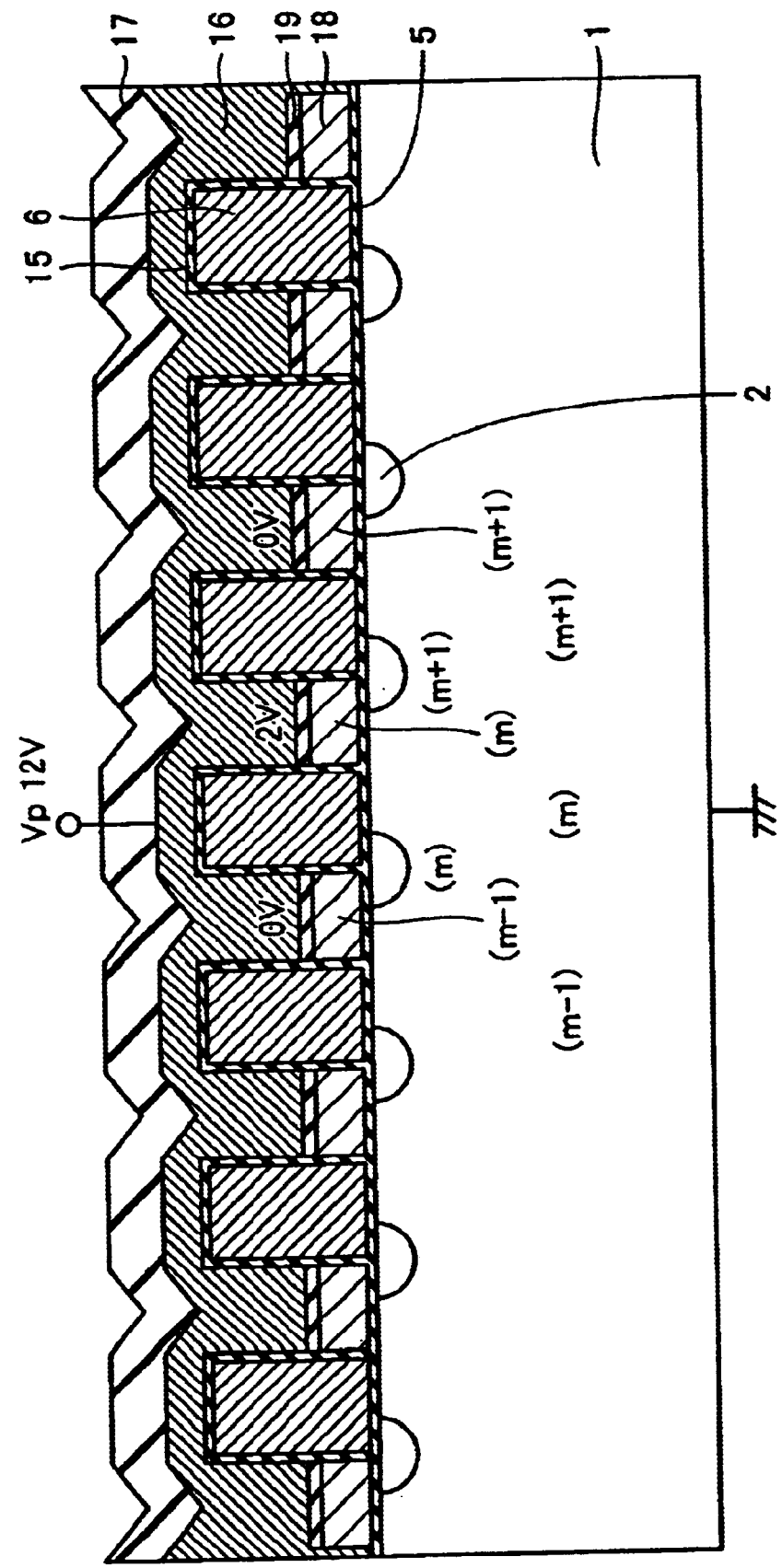
FIG. 22 illustrates a writing operation in a conventional non-volatile semiconductor memory device.
Figure 23A:
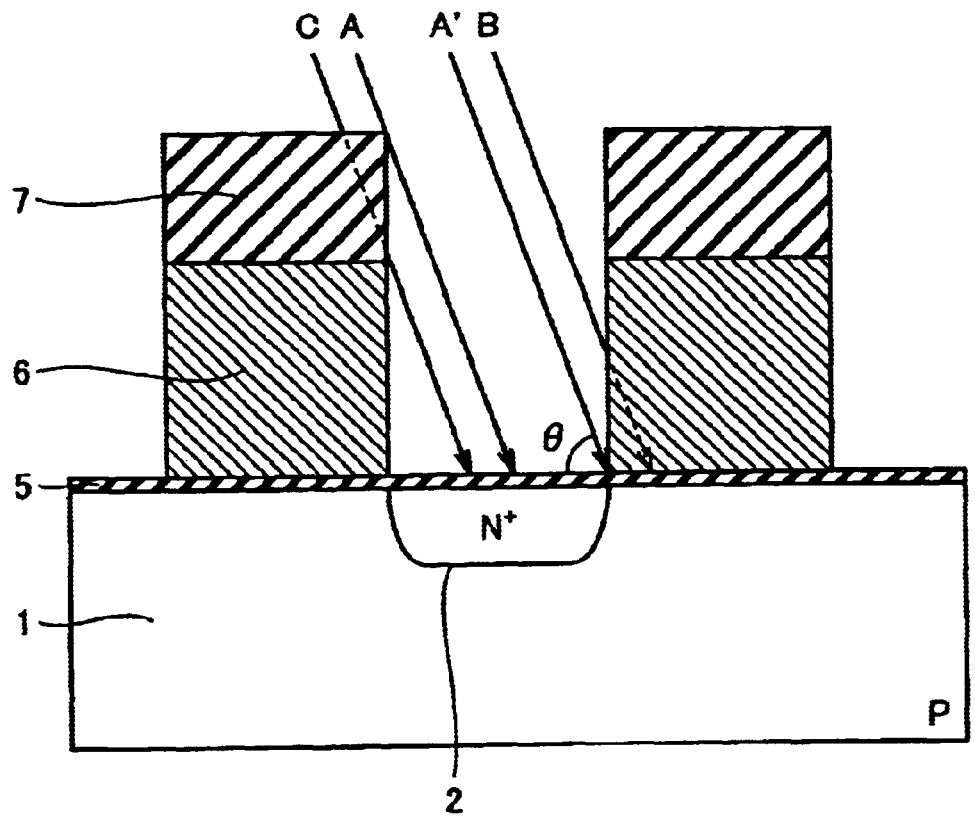
FIG. 23A is a cross section representing a conventional method of introducing arsenic.
Figure 23B:
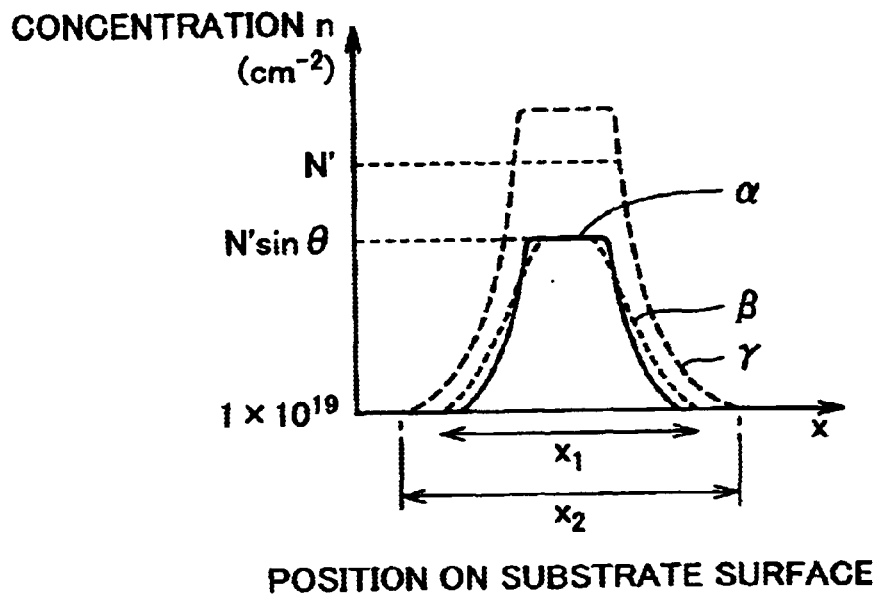
FIG. 23B represents an exemplary concentration distribution of arsenic in the prior art.

As arsenic is introduced from the direction vertical to the main surface of semiconductor substrate 1, the distribution of the arsenic comes close to rectangular, as represented by δ in FIG. 13B. More specifically, the concentration gradient of N$^+$ diffusion layer 2 can significantly be lowered as compared with the prior art example shown in FIG. 23B. When the width X0 of the present invention shown in FIG. 13B and the width X1 of the prior art example shown in FIG. 23B are the same, the area of the region surrounded by δ in FIG. 13B becomes larger than the area of the region surrounded by α in the prior art example of FIG. 23B. As the area represents the total amount of arsenic, the total amount of arsenic included in N$^+$ diffusion layer 2 is larger in the present invention. In other words, the resistance of N$^+$ diffusion layer 2 can be reduced as compared with the prior art example.

Further, as the N$^+$ diffusion layer 2 is formed between polycrystalline silicon films 6 using polycrystalline silicon films 6 as a mask, it becomes possible to form N$^+$ diffusion layer 2 self-aligned with adjacent polycrystalline silicon films 6. Thus, the area occupied by N$^+$ diffusion layer 2, which will be the source or drain of the memory transistor, can be reduced.

Further, as the arsenic is introduced to semiconductor substrate 1 from the vertical direction as described above, introduction of arsenic to silicon oxide film 5 can be avoided. Therefore, damage to the tunnel insulating film of the memory transistor can be prevented.

After arsenic ions are introduced to semiconductor substrate 1, the photoresist pattern is removed. Thereafter, thermal processing is performed for 30 sec. at 800° C. to 850° C., to form N$^+$ diffusion layer 2 between polycrystalline silicon films 6.

When such a thermal processing as described above is performed after introduction of arsenic, arsenic is diffused and arsenic distribution changes as represented by η of FIG. 13B. When the region of which arsenic concentration is at least 1×10$^{19}$ cm$^{-2}$ is defined as the arsenic diffusion region, the width thereof is X0.

As described above, when the width X0 of FIG. 13B is equal to the width X1 of FIG. 23B, the total amount of arsenic in N$^+$ diffusion layer 2 is larger in the present invention. In order to make equal the total amount of arsenic, it is necessary to enlarge the width of N$^+$ diffusion layer 2 as represented by the width X2 of FIG. 23B, and hence larger diffusion layer is necessary as compared with the present invention.

Figure 3:
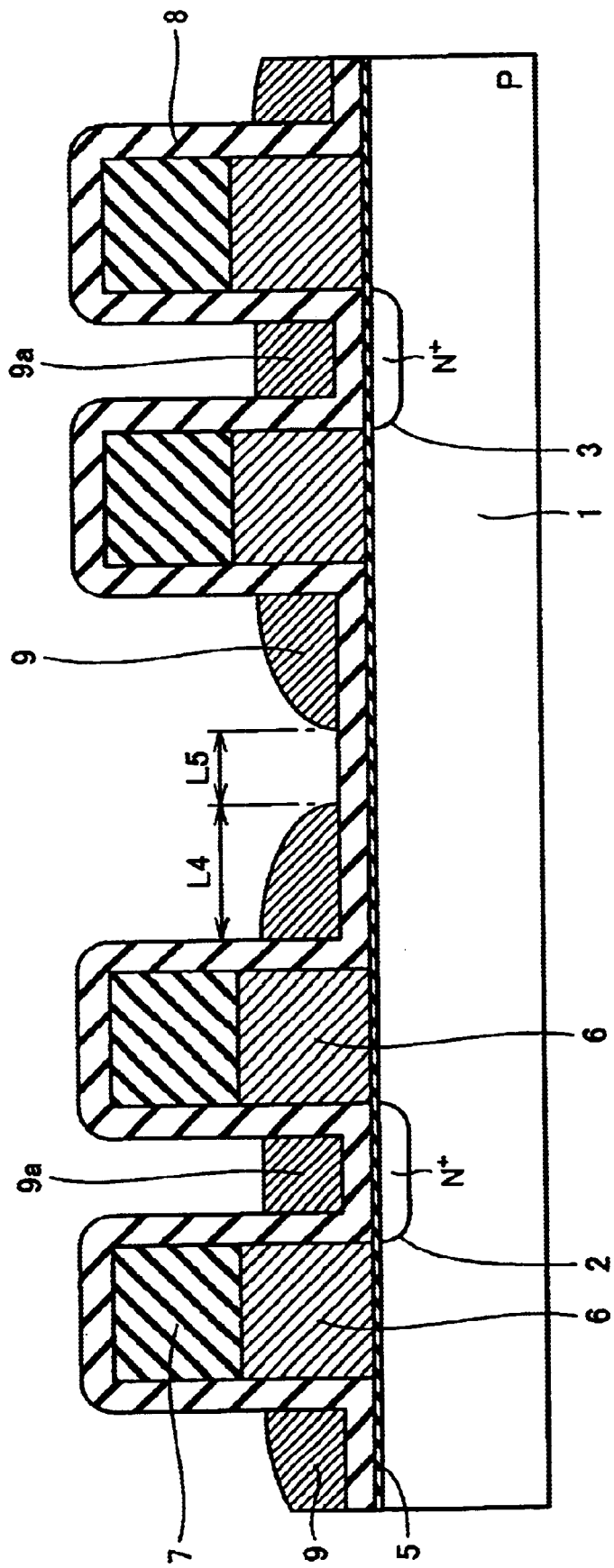

Thereafter, referring to FIG. 3, a silicon oxide film (second insulating film) 8 of 30 nm is deposited to cover polycrystalline silicon films 6 and silicon nitride films 7 by the reduced pressure CVD method. Thereafter, a phosphorus doped polycrystalline silicon film (conductive film) of 130 nm is deposited by the reduced pressure CVD method. By etching back the polycrystalline silicon film, polycrystalline silicon films (second conductive film patterns) 9, 9a are left on sidewalls of polycrystalline silicon film 6.

Accordingly, on a region where the space between polycrystalline silicon films 6 is relatively wide, polycrystalline silicon films 9 can be formed in self-aligned manner with respect to the polycrystalline silicon film 6. In this stage, polycrystalline silicon film 9a is also left on the region where the space between polycrystalline silicon films 6 is relatively narrow.

Polycrystalline silicon film 9 has a sidewall shape as shown in FIG. 3, the width L4 of polycrystalline silicon film 9 is, for example, 130 nm, and the space L5 between adjacent polycrystalline silicon films 9 is, for example, 70 nm.

As the polycrystalline silicon films 9 are formed in self-aligned manner, it becomes unnecessary to ensure the margin for forming polycrystalline silicon films 9, and miniaturization of the memory transistor becomes possible.

Thereafter, referring to FIG. 4, a photoresist pattern 10 is formed by photolithography. Photoresist pattern 10 covers polycrystalline silicon films 9, and extends over the stacked structure of polycrystalline silicon film 6 and silicon nitride film 7. Using photoresist pattern 10 as a mask, polycrystalline silicon film 9a is removed by etching. Thereafter, photoresist pattern 10 is removed.

Figure 5:
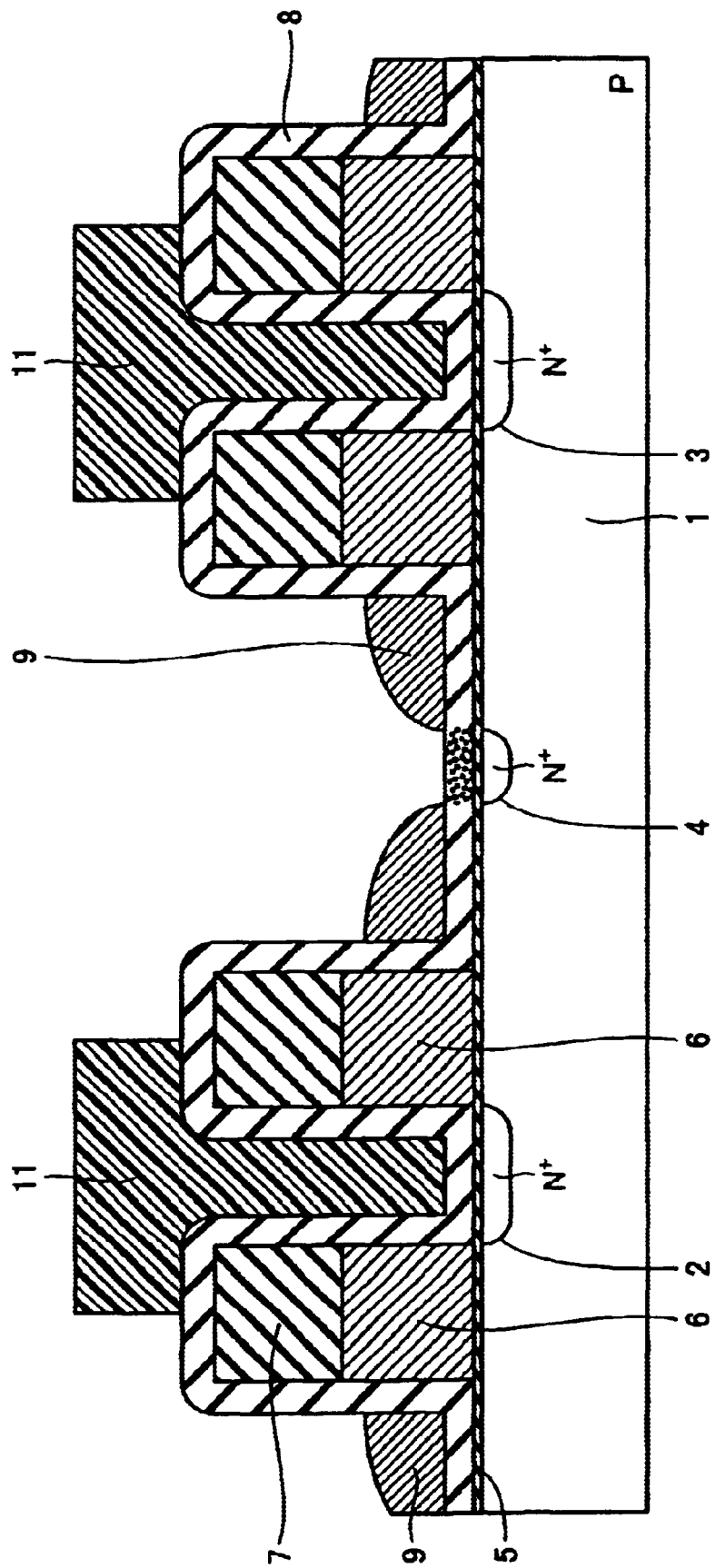
Figure 6:
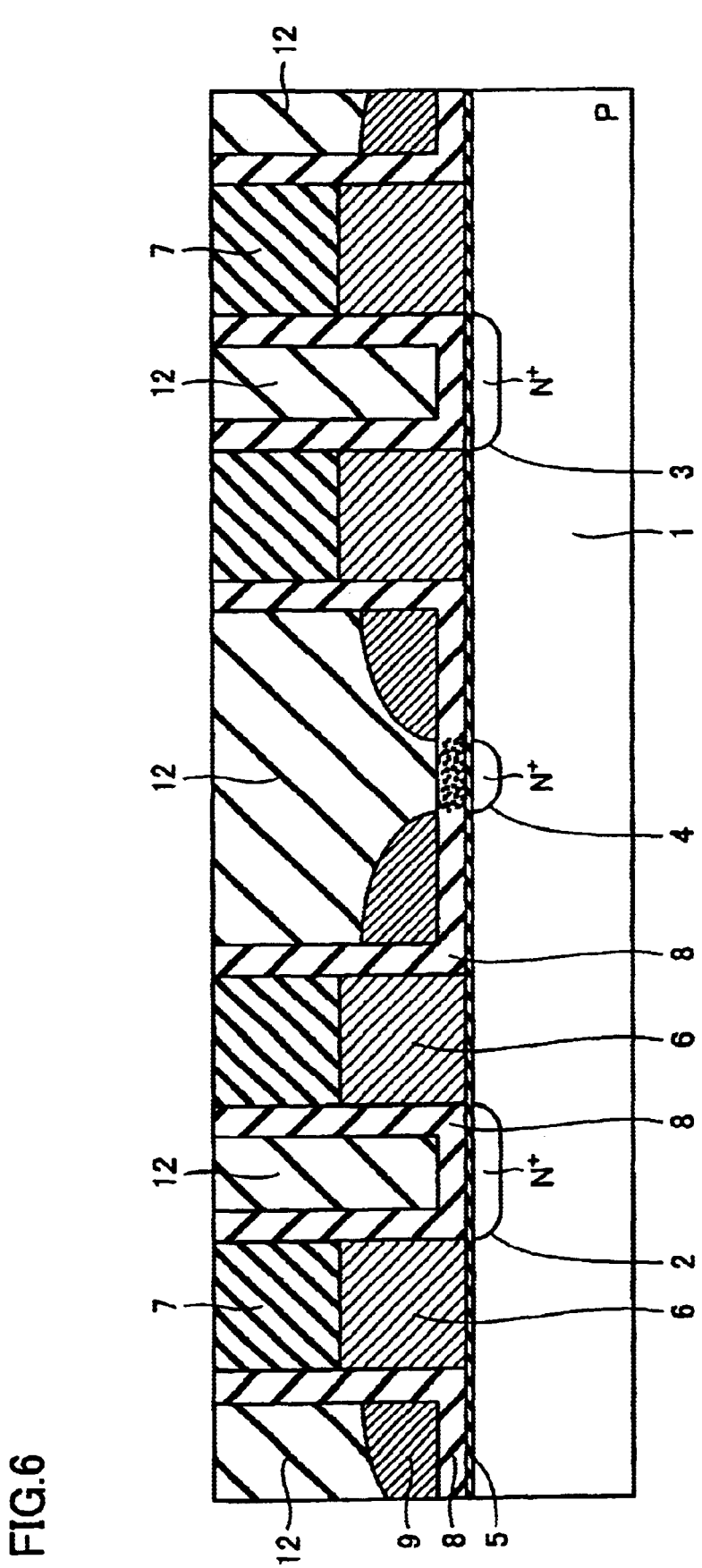

Thereafter, referring to FIG. 5, a photoresist pattern 11 is formed by photolithography. Photoresist pattern 11 covers the relatively narrow region between polycrystalline silicon films 6, and extends over the stacked structure of polycrystalline silicon film 6 and silicon nitride film 7 on both sides thereof.

Using the above described photoresist pattern 11, polycrystalline silicon film 6, silicon nitride film 7 and polycrystalline silicon film 9 as a mask, arsenic ions are introduced to semiconductor substrate 1. The condition for introduction is 70 keV and $4 \times 10^{15}$ cm$^{-2}$. Thereafter, thermal processing is performed for 30 sec. at 800° C. to 850° C., and N$^+$ diffusion layer 4 is formed in self-aligned manner between polycrystalline silicon films.

In the formation of N$^+$ diffusion layer 4, again, arsenic is introduced from the direction vertical to the main surface of semiconductor substrate 1. Thus, similar effects as obtained for N$^+$ diffusion layer 2 can be obtained.

Thereafter, a silicon oxide film 12 of 500 nm is deposited by the reduced pressure CVD method. Silicon oxide film 12 is planarized by the CMP (Chemical Mechanical Polishing) method. At this time, part of silicon oxide film 8 is also polished. By the CMP, silicon oxide film 12 comes to fill the space between polycrystalline silicon films 6, and exposes the surface of silicon nitride film 7.

Figure 7:
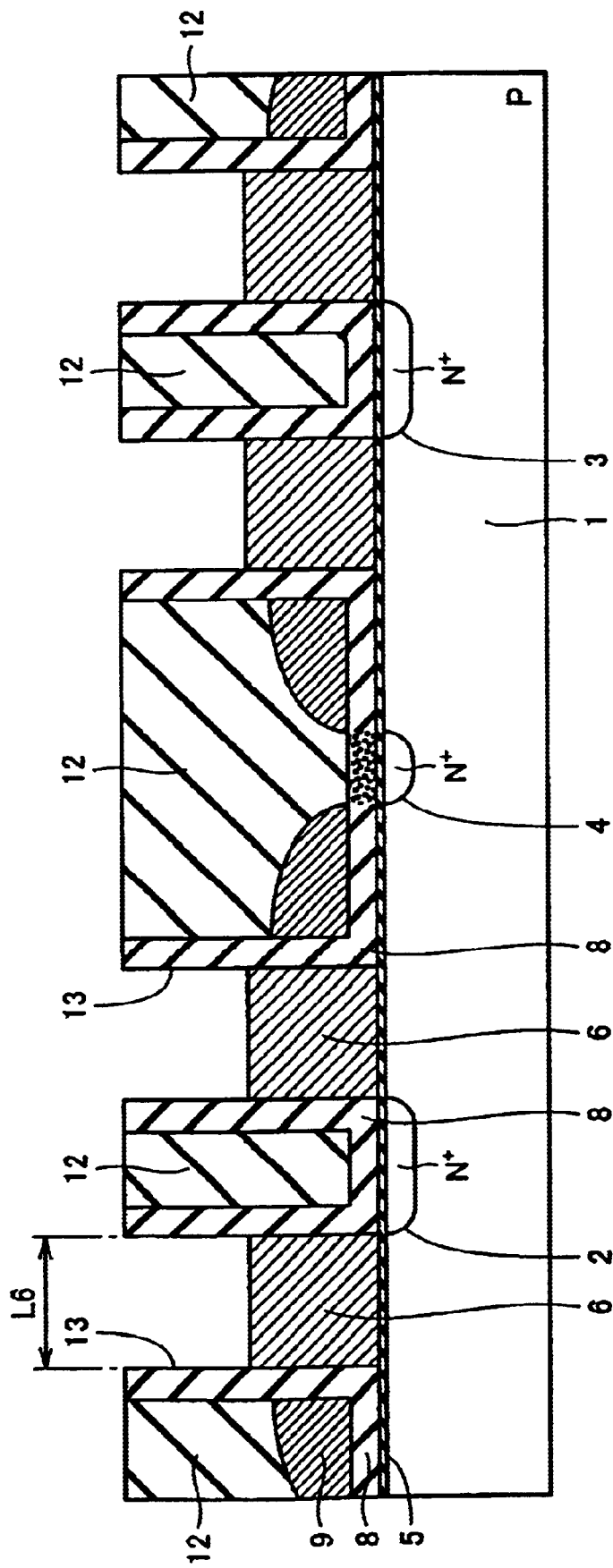

Thereafter, silicon nitride film 7 is removed by hot phosphoric acid. Thus, a recessed portion 13 having the opening width L6 of 150 nm is formed on polycrystalline silicon film 6, as shown in FIG. 7.

Figure 8:
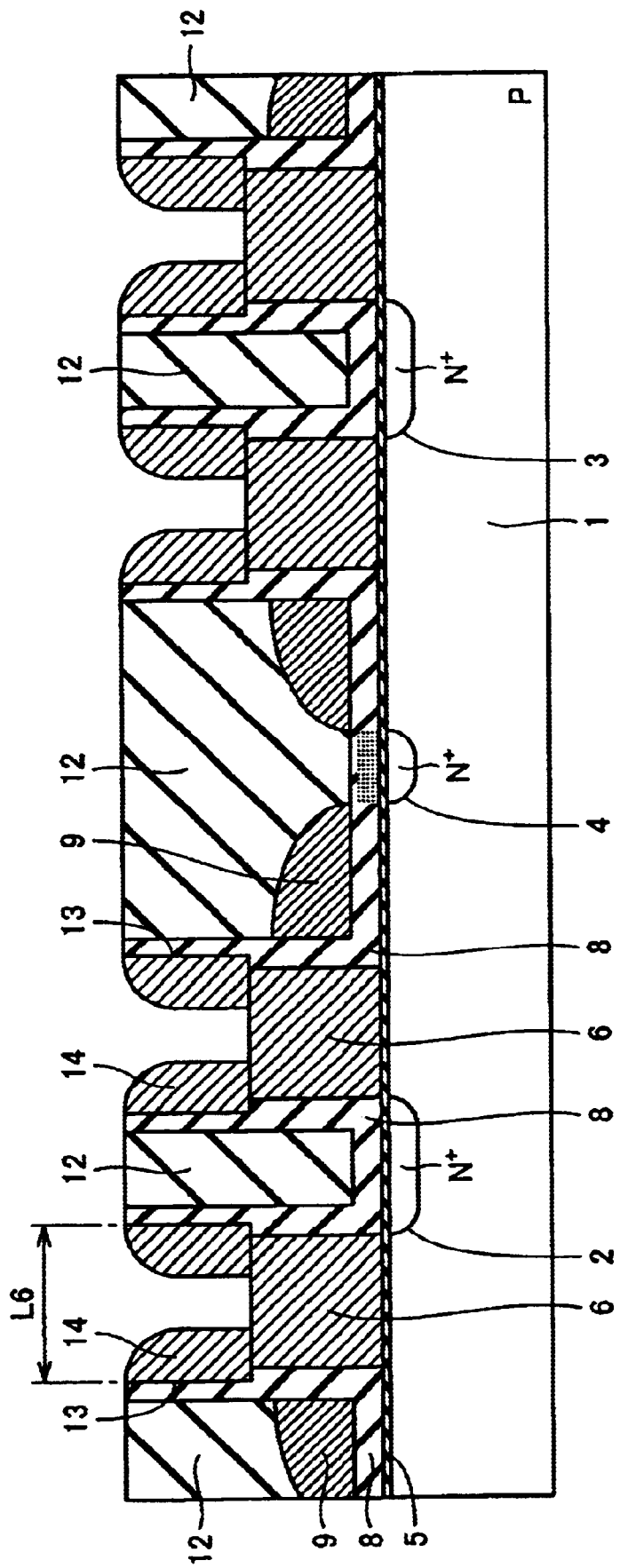

Thereafter, the surface of polycrystalline silicon film 6 is washed by HF solution, and thereafter, phosphorus doped polycrystalline silicon film of 50 nm is deposited by the reduced pressure CVD method. The polycrystalline silicon film is etched back, to form a sidewall conductive film 14 on polycrystalline silicon film 6, as shown in FIG. 8.

Sidewall conductive film 14 is formed on a sidewall of recessed portion 13 and extends upward. By the provision of such a sidewall conductive film 14, opposing area between the floating gate and the control gate can be increased, and the capacitance between the floating gate and the control gate is ensured.

Figure 9:
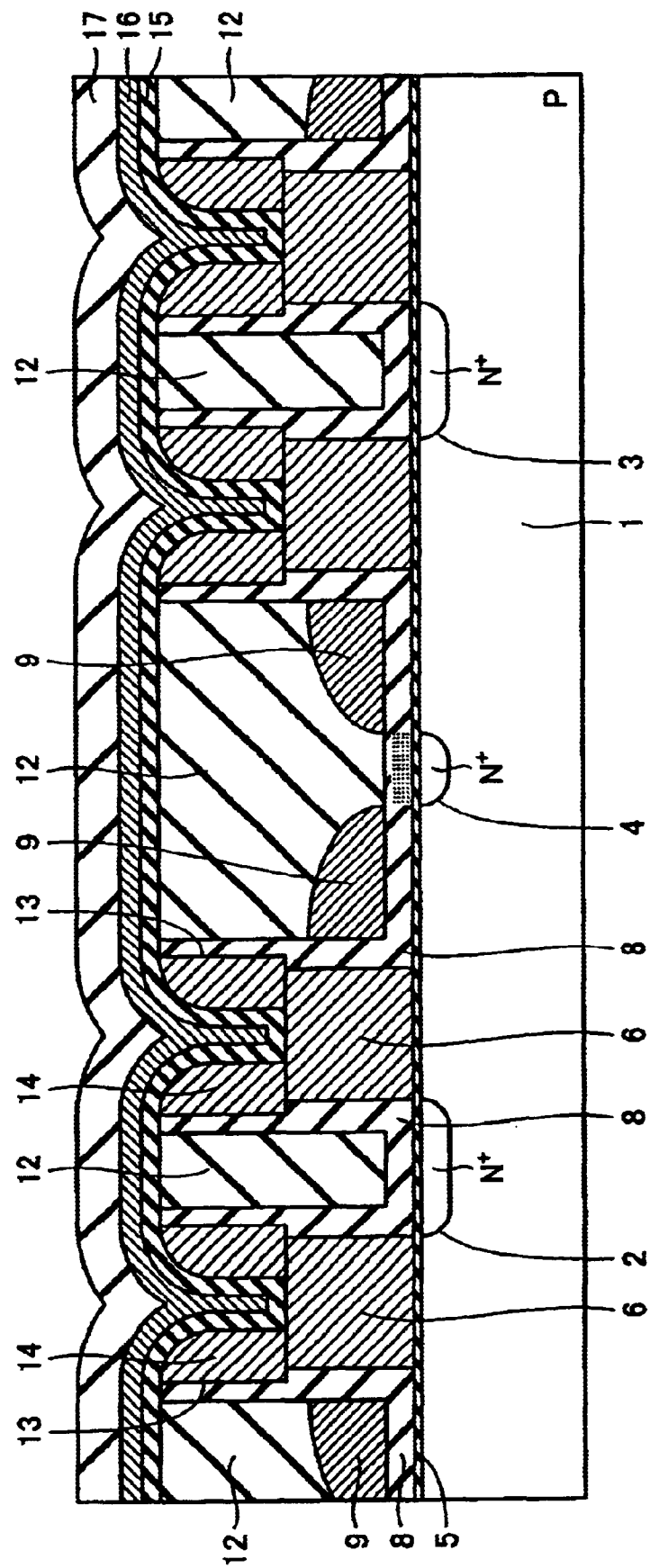

Thereafter, a silicon oxide film of 5 nm, a silicon nitride film of 10 nm and a silicon oxide film of 5 nm are deposited by the reduced pressure CVD to form interlayer insulating film 15 as shown in FIG. 9. Further, a phosphorus doped polycrystalline silicon film of 100 nm is deposited by the reduced pressure CVD method, and a WSi film of 100 nm is deposited by the CVD method to form a conductive film 16. Thereafter, a silicon oxide film 17 of 200 nm is deposited by the reduced pressure CVD method.

By photolithography and etching, silicon oxide film 17 and conductive film 16 are processed to stripes, to form control gates. Thereafter, using silicon oxide film 17 and conductive film 16 as a mask, interlayer insulating film 15 is etched. Further, using the patterned silicon oxide film 17 and conductive film 16 as a mask, polycrystalline silicon films 14 and 6 are etched to form floating gates.

Through the above described steps, the non-volatile semiconductor memory device shown in FIG. 1 is completed.

Figure 10:
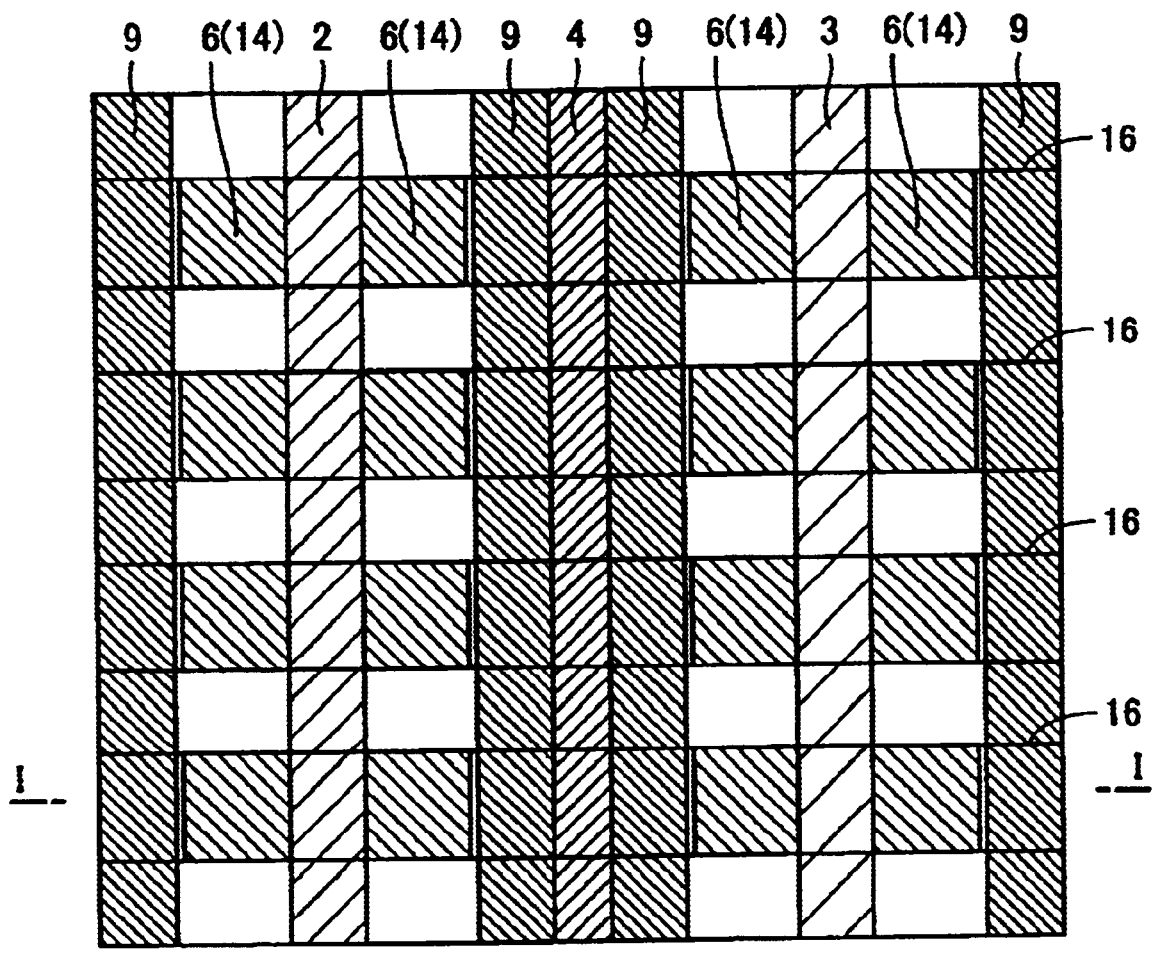
FIG. 10 is a plan view of the non-volatile semiconductor memory device shown in FIG. 1.

Referring to FIG. 10, a planar structure of the memory cell region of the non-volatile semiconductor memory device in accordance with the present invention will be described. FIG. 10 is a plan view of the memory cell region of the non-volatile semiconductor memory device in accordance with the present invention, of which cross section taken along the line I—I corresponds to FIG. 1.

As can be seen from FIG. 10, polycrystalline silicon film (floating gate) 6 is provided as an island, and N$^+$ diffusion layers 2 to 4 and polycrystalline silicon film (access gate) 9 extend in the longitudinal direction of FIG. 10, while the conductive film (control gate) 16 extends in the lateral direction orthogonally crossing the direction of extension of N$^+$ diffusion layers 2 to 4 and the access gate.

According to the present invention, generation of such a concentration gradient as observed in the prior art in the impurity diffusion layer of the memory transistor can be suppressed. Thus, increase in resistance of the impurity diffusion layer can be avoided and performance of the non-volatile semiconductor memory device is improved.

Further, as the impurity diffusion layers can be formed in self-aligned manner with adjacent floating gates or access gates. Therefore, the area occupied by the impurity diffusion layers can be maintained small. This enables reduction in memory size and reduction in manufacturing cost of the non-volatile semiconductor memory device.

Further, as the damage to the tunnel insulating film of the memory transistor can also be avoided, degradation in reliability of the non-volatile semiconductor memory device can also be prevented.

Further, as it becomes unnecessary to diffuse the impurity from below the access gate to a portion below the floating gate, thermal diffusion process or increase in energy for introducing impurity is unnecessary. Thus, miniaturization of the memory transistor is facilitated.

Preferably, the set of access gates is partially overlapped on the second impurity diffusion layer. Here, the second impurity diffusion layer is formed in self-aligned manner with the access gates. As the second impurity diffusion layer is formed in a self-aligned manner between the set of access gates, the area occupied by the second impurity diffusion layer can be reduced. Thus, it becomes possible to provide a second impurity diffusion layer having small area of occupation and low resistance.

Preferably, the floating gate and another floating gate are partially overlapped with the first impurity diffusion layer. Here, the first impurity diffusion layer is formed in a self-aligned manner with one and another floating gates. Here again, as in the second impurity diffusion layer described above, it becomes possible to provide the first impurity diffusion layer having small area of occupation and low resistance.

Preferably, when electrons are introduced to the floating gate, the second impurity diffusion layer serves as the source of the memory transistor while the first impurity diffusion layer serves as the drain of the memory transistor. Preferably, in a reading operation, the second impurity diffusion layer serves as the drain of the memory transistor and the first impurity diffusion layer serves as the source of the memory transistor. When electrons are drawn out from the floating gate, it is preferred that the potential of the control gate is set lower than the potentials of the first and second impurity diffusion layers and of the semiconductor substrate. Further, when electrons are drawn out from the floating gate, it is preferred that the potential of the access gate is set lower than the potentials of the first and second impurity diffusion layers and of the semiconductor substrate.

Preferably, in a method of manufacturing a non-volatile semiconductor memory device of the present invention, the step of forming the first impurity diffusion layer includes the step of forming the first impurity diffusion layer in self-aligned manner with respect to adjacent patterns of the floating gate (first conductive film patterns), and the step of forming the second impurity diffusion layer includes the step of forming the second impurity diffusion layer in self-aligned manner with respect to adjacent the patterns of the access gate (second conductive film patterns). Thus, it becomes possible to reduce the area occupied by the first and second impurity diffusion layers.

Preferably, the step of forming the patterns of the floating gates includes the step of forming the patterns of the floating gates such that the spaces between adjacent patterns of the floating gates differ. For example, assume that there is a pattern, and on both sides of the pattern, there are neighboring patterns. The pattern of the floating gate is formed such that the space between the central pattern and the pattern on one side thereof is different from the space between the central pattern and the pattern on the other side. Further, the step of forming the first impurity diffusion layer includes the step of forming the first impurity diffusion layer in the region where the space between the patterns of the floating gates is relatively narrow, and the step of forming the patterns of the access gates includes the step of forming the patterns of the access gates on the region where the space between the patterns of the floating gates is relatively wide.

As the spaces between adjacent patterns of the floating gates are made different, it becomes possible to form the first impurity diffusion layer in a region which is relatively narrow, and to form the patterns of the access gates in a region which is relatively wide. Namely, it becomes possible to form the first impurity diffusion layer on the side of one sidewall of the pattern of the floating gate and to form patterns of the access gates on the side of the other sidewall.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
   a semiconductor substrate of a first conductivity type having a main surface;
   first and second impurity diffusion layers of a second conductivity type of a first memory cell formed spaced from each other at the main surface of said semiconductor substrate;
   a floating gate of said first memory cell formed on a region between said first and second impurity diffusion layers with a first insulating film interposed, the floating gate having an upper surface;
   an access gate of said first memory cell formed adjacent to said floating gate on a region between said first and second impurity diffusion layers with a second insulating film interposed, the access gate having an upper surface lower than the upper surface of the floating gate with respect to the main surface;
   a control gate of said first memory cell formed on said floating gate with a third insulating film interposed; and
   another access gate of a second memory cell provided at a position adjacent to said access gate of said first memory cell with said second impurity diffusion layer positioned therebetween.

2. The non-volatile semiconductor memory device according to claim 1, wherein
   said access gate and said another access gate are partially overlapped with said second impurity diffusion layer; and
   said second impurity diffusion layer is formed in self-aligned manner with respect to said access gate and said another access gate.

3. A non-volatile semiconductor memory device, comprising:
   a semiconductor substrate of a first conductivity type having a main surface;
   first and second impurity diffusion layers of a second conductivity type of a first memory cell formed spaced from each other at the main surface of said semiconductor substrate;
   a floating gate of said first memory cell formed on a region between said first and second impurity diffusion layers with a first insulating film interposed, the floating gate having an upper surface;
   an access gate of said first memory cell formed adjacent to said floating gate on a region between said first and second impurity diffusion layers with a second insulating film interposed, the access gate having an upper surface lower than the upper surface of the floating gate with respect to the main surface;
   a control gate of said first memory cell formed on said floating gate with a third insulating film interposed,
   another floating gate of a second memory cell provided at a position adjacent to said floating gate of said first memory cell with said first impurity diffusion layer positioned therebetween; and
   another control gate of said second memory cell formed on said another floating gate with said third insulating film interposed.

4. The non-volatile semiconductor memory device according to claim 3, wherein
   said floating gate and said another floating gate are partially overlapped with said first impurity diffusion layer; and
   said first impurity diffusion layer is formed in self-aligned manner with respect to said floating gate and said another floating gate.

5. A non-volatile semiconductor memory device, comprising:
   a semiconductor substrate of a first conductivity type having a main surface;
   first and second impurity diffusion layers of a second conductivity type formed spaced from each other at the main surface of said semiconductor substrate;

a floating gate formed on a region between said first and second impurity diffusion layers with a first insulating film interposed, the floating gate having an upper surface;

an access gate having a sidewall shape formed adjacent to said floating gate in a region between said first and second impurity diffusion layers with a second insulating film interposed, the access rate having an upper surface lower than the upper surface of the floating gate with respect to the main surface; and a control gate formed on said floating gate with a third insulating film interposed.

6. The non-volatile semiconductor memory device according to claim 5, further comprising:

another floating gate provided at a position adjacent to said floating gate with said first impurity diffusion layer positioned therebetween; and another access gate having a sidewall shape provided at a position adjacent to said access gate with said second impurity diffusion layer positioned therebetween; wherein said first impurity diffusion layer is partially overlapped with said floating gate and said another floating gate; and said second impurity diffusion layer is partially overlapped with said access gate and said another access gate.

7. The non-volatile semiconductor memory device according to claim 1, wherein said second impurity diffusion layer serves as a source and said first impurity diffusion layer serves as a drain, when electrons are introduced to said floating gate.

8. The non-volatile semiconductor memory device according to claim 1, wherein said second impurity diffusion layer serves as a drain and said first impurity diffusion layer serves as a source in a reading operation.

9. The non-volatile semiconductor memory device according to claim 1, wherein potential of said control gate is made lower than potentials of said first and second impurity diffusion layers and of said semiconductor substrate, when electrons are drawn out from said floating gate.

10. The non-volatile semiconductor memory device according to claim 9, wherein potential of said access gate is made lower than potentials of said first and second impurity diffusion layers and of said semiconductor substrate, when electrons are drawn out from said floating gate.

* * * * *